United States Patent [19]

Sato et al.

[11] Patent Number: 5,053,652
[45] Date of Patent: Oct. 1, 1991

[54] HIGH SPEED SENSOR SYSTEM USING A LEVEL SHIFT CIRCUIT

[75] Inventors: Yoichi Sato, Iruma; Masao Mizukami, Yokohama; Toshiyuki Ookuma, Ohme, all of Japan

[73] Assignee: Hitachi, Ltd., Tokyo, Japan

[21] Appl. No.: 637,591

[22] Filed: Jan. 4, 1991

Related U.S. Application Data

[62] Division of Ser. No. 303,472, Jan. 30, 1989, Pat. No. 4,984,204.

[30] Foreign Application Priority Data

| Jan. 28, 1988 | [JP] | Japan | 63-17586 |
| May 24, 1988 | [JP] | Japan | 63-126891 |
| Aug. 3, 1988 | [JP] | Japan | 63-193997 |
| Aug. 12, 1988 | [JP] | Japan | 63-201470 |
| Nov. 17, 1988 | [JP] | Japan | 63-290758 |
| Nov. 25, 1988 | [JP] | Japan | 63-295955 |

[51] Int. Cl.⁵ ............................................. H03F 3/45
[52] U.S. Cl. ..................................... 307/530; 307/279
[58] Field of Search ................... 307/530, 279, 475; 365/203, 205, 207, 208, 189.11

[56] References Cited

U.S. PATENT DOCUMENTS

| 4,618,785 | 10/1986 | Van Tran | 365/208 |
| 4,724,344 | 2/1988 | Watanabe | 307/530 |
| 4,758,995 | 7/1988 | Sato | 365/189.05 |
| 4,782,251 | 11/1988 | Tsugaru et al. | 307/475 |
| 4,811,295 | 3/1989 | Shinoda | 365/189.05 |
| 4,816,706 | 3/1989 | Dhong et al. | 365/205 |
| 4,888,737 | 12/1989 | Sato | 365/203 |
| 4,908,794 | 3/1990 | Yamaguchi | 365/207 |
| 4,930,112 | 5/1990 | Tanaka et al. | 365/227 |
| 4,954,992 | 9/1990 | Kumanoya | 307/530 |

OTHER PUBLICATIONS

"A 64Kb Static Ram", Digest of Technical Papers, pp. 236-237 (1980 IEEE Int. Solid State Circuits Conference, Feb. 15, 1980), by T. Ohzone et al.

Primary Examiner—David Hudspeth
Assistant Examiner—Andrew Sanders
Attorney, Agent, or Firm—Antonelli, Terry, Stout & Kraus

[57] ABSTRACT

A semiconductor memory device has a sense amplifier which is constructed with a level shift circuit having an input which senses the change in a data line from an initial precharged level to a level near the vicinity of the supply voltage level which corresponds to data reading amounts from a memory cell during the reading mode of operation of the memory. The level shift circuit, in response to a memory cell reading signals, provides a level shifted outpout to the input terminal of a differential sense amplifier circuit, the level shifted output being in the vicinity of the operating point of the differential sense amplifier circuit. The level shift circuit includes a current amplifier having an output terminal that is formed with a series connecting node of a current amplifying transistor and a current source.

50 Claims, 17 Drawing Sheets

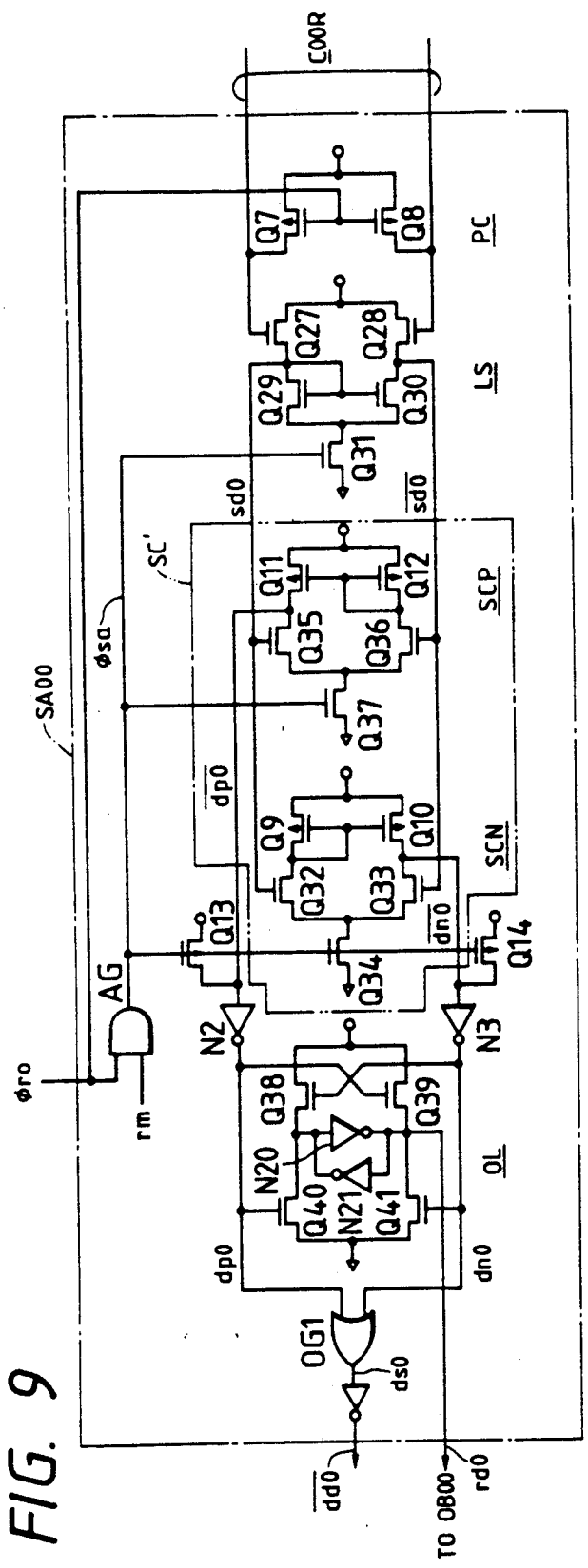
FIG. 9
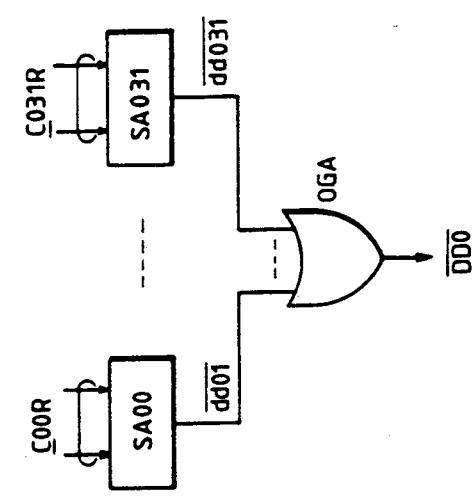
FIG. 10
FIG. 8

HIGH SPEED SENSOR SYSTEM USING A LEVEL SHIFT CIRCUIT

This is a divisional of application Ser. No. 303,472, filed Jan. 30, 1989, now U.S. Pat. No. 4,984,204.

BACKGROUND OF THE INVENTION

This invention relates to a semiconductor device, and more particularly, to a sensing amplifier driving system, for example, techniques for providing the reading operation, of SRAM (static random access memory) at high speed and low power-consumption, whereby a bit line and a common data line are precharged to a desired level.

In the conventional manner, one bit line of a complementary pair of bit lines is supplied with a power supply voltage, the other bit line is supplied with the ground potential of a circuit; each line is charged, and then the complementary bit lines are short-circuited to precharge both bit lines to the intermediate level by effecting a re-distribution of charges. Such techniques are found in the specifications of U.S. Ser. No. 860,411, U.S. Ser. No. 943,063, filed Dec. 18, 1986, and U.S. Ser. No. 60,334.

However, the above precharging system of bit and common data lines requires two operational steps, that is, the operation to charge the complementary bit lines to the power supply voltage and the ground potential, respectively, and the succeeding operation to short-circuit the complementary bit lines. Moreover, in the precharging period, a waiting time for selection of word lines to write data is necessary so as to prevent writing error data into a memory cell. Therefore, not only is the timing for reading data complex, but there is a limitation of high-speed data read-out because of a longer access time. Such disadvantages are made clear by a careful reading of the present invention and as it relates to the disclosed embodiments.

For more high-speed operation, the specification of co-pending U.S. Ser. No. 148,432, filed Jan. 26, 1988, describes another precharging system, where a pair of bit lines are precharged to the power supply voltage, and a pair of common data lines are precharged to the ground potential. In this system, however, the voltage of the common data lines changes from the ground voltage, so it is clear that data is difficult to be read with high speed. Japanese Patent Laid-open No. 63-58697 (published on the 14th of March, 1988) describes the system to select a common data line voltage using the voltage divided by resistors.

SUMMARY OF THE INVENTION

The object of the present invention is to provide semiconductor memory having a sensing amplifier and a driver that can perform the data read-out operation at high-speed and low power consumption. More particularly, the object of the invention is to supply a level shift circuit applicable to the sensing amplifier driving system of a semiconductor memory.

Such objects and inventive features will be clear with the description of the specification and the attached drawings.

Outline of the representative embodiments disclosed in the present invention is described as the following.

The semiconductor memory according to the present invention has a level shift circuit that shifts a read-out signal of a memory cell to the level near the operational point of the sensing amplifier so as to supply the signal to the input terminal of the sensing amplifier.

The level shift circuit includes a current amplifier, the output terminal of which is the series connecting node of a current amplifying transistor and a power supply, and in which a change in a voltage of the output terminal depends on the input voltage of the current amplifying transistor. The level shift circuit also includes a power switch that opens a direct-current circuit according to the activation of the sensing amplifier.

Furthermore, the level shift circuit includes a pair of current amplifiers, the output terminal of which is the series connecting node of a current amplifying transistor and a power supply, and which a change in voltage of the output terminal depends on the input voltage of the current amplifying transistor; the output terminal of each current amplifier is connected to a respective transistor load having a different conductivity type from that of the above mentioned current amplifying transistor; and the control terminal of one transistor load is connected to the control terminal and output terminal of the other current amplifier. In this case, current sources included in the above pair of current amplifiers can be constructed with a current mirror circuit.

BRIEF DESCRIPTION OF THE DRAWINGS

FIG. 8 is a circuit diagram of another embodiment of the sensor-amplifier of the circuit shown in FIG. 5.

FIG. 9 is a circuit diagram of another embodiment of the sensor-amplifier shown in FIG. 5.

FIG. 10 is a circuit diagram of still another embodiment of the sensing circuit shown in FIG. 9.

DESCRIPTION OF THE PREFERRED EMBODIMENTS

Figure 1:
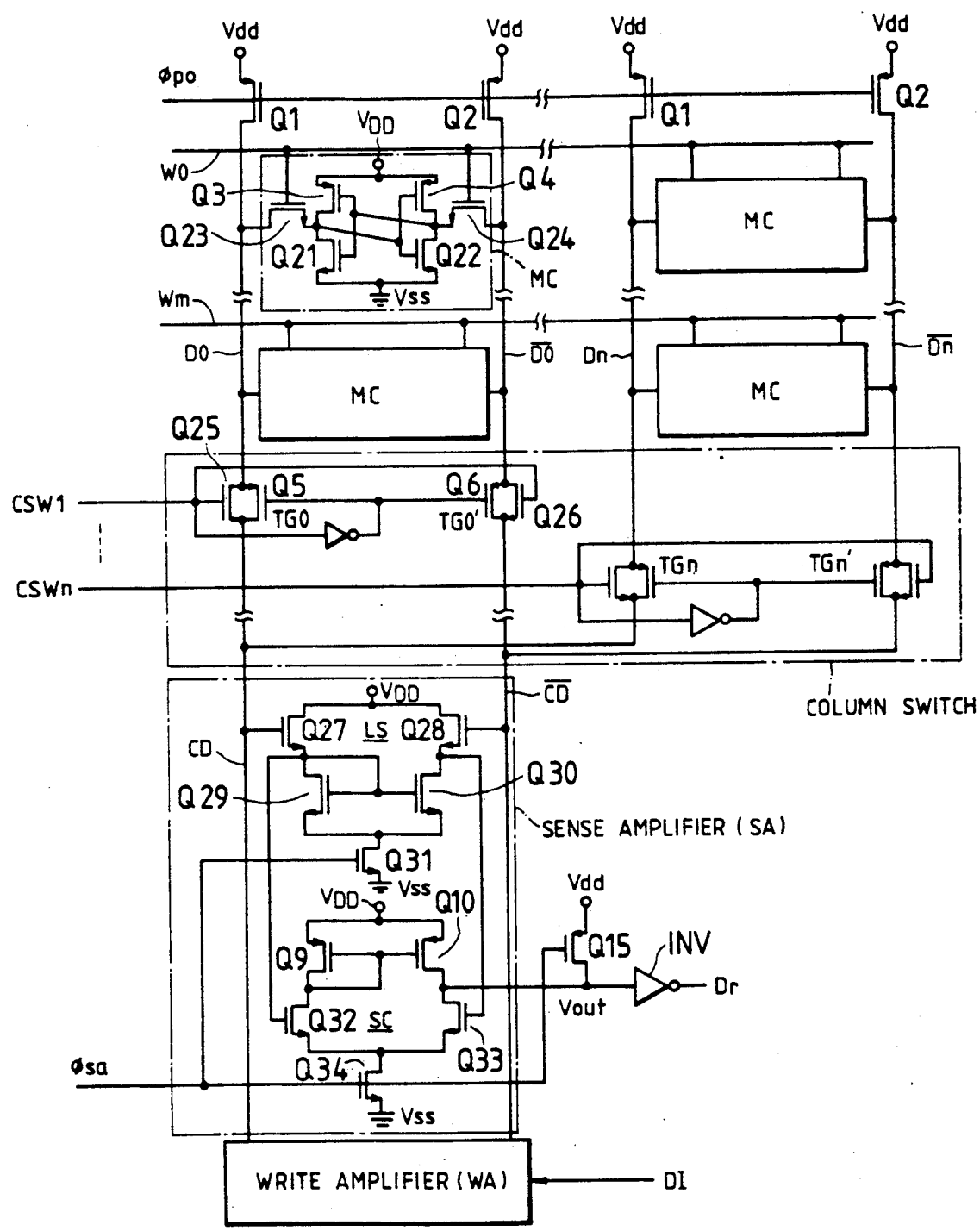
FIG. 1 is a circuit diagram of an embodiment of the SRAM according to the present invention.

FIG. 1 is a circuit diagram illustrating an embodiment of a SRAM according to the present invention.

The SRAM shown in the figure formed on a semiconductor substrate by using the known MOS integrated circuit production technology is to be construed as exemplary only rather than limiting the invention thereto.

The SRAM of this embodiment has a memory cell array forming a matrix with a plurality of static memory cells 1. The memory cell 1, although not limited thereto, is constructed with a flip-flop circuit, in which an input terminal and an output terminal of a pair of CMOS (complementary MOS) inverter circuits are cross-coupled to each other, the inverter circuits being constructed with P-channel MOSFETs Q3, Q4 and N-channel MOSFETs Q21, Q22 and is constructed with a pair of N-channel selective or switching MOSFETs Q23, Q24, each having a source electrode connected to a respective output terminal of the above CMOS inverter circuits. The drain electrodes of the selective MOSFETs Q23, Q24 form both data input and output terminals of a memory cell MC, and their gate electrodes form selective terminals of the memory cell MC.

The data input and output terminals of the above memory cells MC are connected with individual pairs of data lines such as representative data line pairs D0, $\overline{D0}$ ~ Dn, $\overline{Dn}$ shown in FIG. 1 for the respective rows, and the selective terminals of the memory cell 1 are connected with word lines W0 ~ Wm, respectively, the same word line for each line or row of the matrix. The predetermined one of the word lines W0 ~ Wm is driven to a selected level corresponding to a row address signal supplied externally, and the driving and control are done by a row address decoder and a word driver not shown in the figure.

One end of the above pair of data lines D0, $\overline{D0}$ is commonly connected to a pair of common data lines Cd, $\overline{CD}$ through CMOS transfer gates TG0, TG0' which are constructed with N-channel MOSFETs Q25, Q26 and P-channel MOSFETs Q5, Q6 as column switching circuits. The fact is the same for the data lines Dn, $\overline{Dn}$, which are commonly connected to a pair of common data lines CD, $\overline{CD}$ through transfer gates TGn, TGn'. The CMOS transfer gates TG0, TG0' ~ TGn, TGn' selectively control for conduction a predetermined pair of bit lines in accordance with custom address signals supplied externally, on a pair of common data lines CD, $\overline{CD}$. To achieve this, column control signals CSW1 ~ CSWn are generated as switching control signals by a column address decoder.

The other ends of the above pair of data lines D0, $\overline{D0}$ ~ Dn, $\overline{Dn}$ are connected with drain electrodes of P-channel precharing MOSFETs Q1, Q2, the source electrodes of which are supplied with a power supply voltage $V_{DD}$. Precharging MOSFETs Q1, Q2 are switched and controlled by a precharging signal $\phi p0$ that is supplied to its gate electrode. A low level of the precharging signal $\phi p0$ switches on each precharging MOSFET Q1 or Q2 and when the precharging MOSFETs Q1, Q2 are switched on, they charge the pair of common data lines CD, $\overline{CD}$ to approximately the power supply voltage level $V_{DD}$ through the pair of data lines D0, $\overline{D0}$ ~ Dn, $\overline{Dn}$ and the CMOS transfer gates TG0, TG0' ~ TGn, TGn', and therefor decreasing to the same level any potential difference generated on the pair of bit lines and the pair of common data lines CD, $\overline{CD}$ by the previous memory access.

The pair of common data lines CD, $\overline{CD}$ are connected with output terminals of a writing and amplifying circuit WA and input terminals of a sensing amplifier SA.

The writing and amplifying circuit WA drives the pair of common data lines CD, $\overline{CD}$ to predetermined complementary levels according to writing data DI that are supplied from a data input buffer not shown in the figure.

The sensing amplifier SA includes a differential sensing amplifier circuit SC, which amplifies a complementary potential difference, the minute level change being close to the power supply voltage $V_{dd}$ as a precharging level; and the level change is generated on the pair of common data lines CD, $\overline{CD}$ by reading data of memory cells. The first stage of the sensing amplifier also includes a level which circuit LS which precedes the sending circuit SC, the former transforming or level shifting the minute level change close to the power supply voltage $V_{dd}$, generated on the pair of common data lines CD, $\overline{CD}$ by reading memory cell data, to a level near the operational point of the circuit SC so as to have the highest sensitivity; the level shift circuit LS provides the level change to the input terminal of the circuit SC.

The above sense amplifier circuit SC which is exemplary only comprises a differential pair of N-channel input MOSFETs Q32, Q33, which are connected with the ground potential Vss through an N-channel power switch MOSFET Q34 as a current source which is connected by its drain electrode to the common source connected ends of Q32, Q33 and at its source electrode to ground. In the sensing circuit Sc, each drain electrode of the input MOSFETs Q32, Q33 is connected with drain electrodes of P-channel MOSFETs Q9, Q10 that construct the loads of a current mirror circuit. The source electrodes of P-channel MOSFETs Q9 and Q10 that construct the loads of the current mirror circuit are connected with the power supply voltage $V_{DD}$, and the common connecting end of their gate electrodes is connected with the drain electrode of the input MOSFET 32. The pair of input terminals of the sensing circuit SC are the gate electrodes of the input MOSFETs Q32 and Q33. An output terminal of the circuit SC is the connecting point of the drain electrodes of MOSFETs Q10 and Q33, and is connected with the input terminal of an output inverter INV. When an amplified voltage Vout of the sensing circuit SC reaches a level that can be detected by the output inverter INV, the inverter INV gives reading data Dr to a data output buffer not shown in the figure. The above mentioned power-switch MOSFET Q34 is controlled and switched by a sense-amplifying signal $\phi$sa that is supplied to its gate electrode. A high level of the sense-amplifying signal $\phi$sa switches on the power-switch MOSFET Q34 to activate the sensing circuit SC. The output terminal of the circuit SC is charged to the power supply voltage $V_{DD}$ by a P-channel MOSFET Q15 when the SC is not activated.

When the circuit SC is activated and its input terminals are supplied with complementary signals, the drain-to-source current flowing through each MOSFET Q32 or Q33 differs, so a drain-to-source current change of MOSFET Q32 changes that of MOSFET Q9, and therefore a source-to-drain voltage of MOSFET Q10 is determined by the above change and the change of a drain-to-source current of MOSFET Q33. For example, when a gate input voltage of MOSFET Q32 is greater than that of MOSFET Q33, a drain voltage of MOSFET Q33, namely an amplified output of the sensing circuit SC, is made higher than a drain voltage of MOSFET Q32. On the other hand, if a gate input voltage of MOSFET Q33 is higher than that of MOSFET Q32, a drain voltage of MOSFET Q33, namely an amplified output of the sensing circuit SC, is made lower than a drain voltage of MOSFET Q32.

In this manner, as the sensing circuit SC has a current change of MOSFETs Q32, Q33 generated by the difference of their gate input voltages and supplies the change of source-to-drain voltages of MOSFET Q10, it is desirable to operate the MOSFETs Q32, Q33, Q9 and Q10 that construct the circuit SC in the saturated region so that the amplification or the amplifying sensitivity of the sensing circuit can be maximized. That is, the differential input levels which can make the amplifying operation of such sensing circuit SC the most sensitive, are complementary levels of which the center is approximately the intermediate level of the power supply voltage $V_{dd}$ to operate the MOSFETs in the saturated region (range close to the voltage $V_{dd}/2$).

The above level shift circuit LS transforms minute, complementary level changes close to the power supply voltage $V_{dd}$ as a precharging level, provided on the pair of common data lines CD, $\overline{CD}$ by reading memory cell data, to the level change near the above operating point, where the amplifying operation of the sensing circuit SC becomes the most sensitive.

That is, the level shift circuit includes a pair of source follower circuits each providing an output source voltage according to the input voltages as the fundamental construction. More specifically, the circuit LS in FIG. 1, which is to be construed as being exemplary only rather than being limited thereto, includes MOSFETs Q27–Q31 wherein the drain electrodes of N-channel driving MOSFETs Q27, Q28, i.e. the current amplifying transistors, are connected with the power supply voltage $V_{DD}$, the gate electrode of one driving MOSFET Q27 is connected with the common data line CD, the gate electrode of the other driving MOSFET Q28 is connected with the common data line $\overline{CD}$, the source electrodes of the above driving MOSFETs Q27, Q28 are connected with the drain electrodes of N-channel MOSFETs Q29, Q30; the common connecting point of the gate electrodes of the MOSFETs Q29, Q30 is connected with the drain electrode of the MOSFET Q29 to form a current mirror circuit and the common connecting end of the source electrodes of the MOSFETs Q29, Q30 which construct a current mirror circuit, is connected with the ground potential Vss through an N-channel power switch MOSFET Q31. A pair of input terminals of the level shift circuit LS are the gate electrodes of the driving MOSFETs Q27, Q28; one output terminal of the level shift circuit LS, namely, the source electrode of the driving MOSFET Q27, is connected with the gate electrode of an input MOSFET Q32, namely, one input terminal of the sensing circuit SC1, and the other output terminal of the level shift circuit LS, namely, the source electrode of the driving MOSFET Q28, is connected with the gate electrode of an input MOSFET Q33, namely, the other input of the sensing circuit SC. The above power switch MOSFET Q31 is controlled and switched by a sense-amplifying signal $\phi$sa that is supplied to its gate electrode, and is activated synchronously with the sensing circuit SC.

An amount of level shifting between the input and the output voltages of the level shift circuit LS, is determined by the threshold voltage of the driving MOSFET Q27 (Q28), a constant depending on a gate oxidation film capacity, carrier movements in a channel and so on, and a drain-to-source current of the MOSFET Q27 (Q28); for example, a power supply of 5 V relating to the operating point of the sensing circuit SC will set the amount of shifting to the range from 2 V to 2.5 V. Therefore, a minute, complementary level change close to the power supply voltage $V_{dd}$, generated on the pair of common data lines CD, $\overline{CD}$ by reading memory cell data, is transformed to the level change close to the intermediate level of the magnitude of the power supply voltage $V_{DD}$, where amplifying operation of the sensing circuit SC becomes the highest sensitivity, and therefore the transformed level change is supplied to the input terminal of the sensing circuit SC.

In particular, the relation between an input and an output of the level shift circuit LS is like that of source followers, so the output response is very fast if an output load capacity is small. In this embodiment, since an output load of the level shift circuit LS is only the input gate capacity of the sensing circuit SC, the time required to shift the level is negligible small. When the level shift circuit LS is activated, a direct current path is formed because of its construction but, as mentioned above, since the load driven by the level shift circuit LS is very small, the high-speed level shift operation is not adversely influenced even if a current flowing through the direct current path is rather small, and therefore constants of MOSFETs, such as the source-to-drain ON state resistance, that are used to construct a level shift circuit are set up properly for effecting a low power consumption.

Next, the data reading operation of the above SRAM will be explained with reference to the time charts of FIG. 2.

When an extremely supplied address signal is confirmed, selective operation is performed on the column in response to the above address signal at time $t_0$ of the predetermined timing, which is synchronized with the external clocks. In this case, a column selection signal CSW1, for example, is made high level instead of CSWn. Therefore, a pair of common data lines, CD, $\overline{CD}$ are made conductive with a pair of data lines D0, $\overline{D0}$ through transfer fates TG0 and TG0'. At that time, precharging MOSFETs Q1, Q2 are already switched on by a precharging signal $\phi p0$, which is controllably set to a low level. The pair of common data lines CD, $\overline{CD}$ and a pair of data lines Dn, $\overline{Dn}$ are charged to the power supply voltage $V_{DD}$ through transfer means TGn, TGn' before the time $T_0$. The precharging signal $\phi p0$ is inverted to a high level at time $t_1$, after the time lapse required to charge the common data lines CD, $\overline{CD}$.

Next, the selective operation is done on the low-level side, at time $t_2$, in response to the above address signal. For example, a word line W0 is driven to a selective or high level, a sense-amplifying signal $\phi$sa is controllably set to a high level, wherein the level shift circuit LS and a sensing circuit SC are activated.

If the word line W0 level is changed to a selective level at time $t_2$, wherein the selective terminal is connected to the word line W0, selective MOSFETs Q23, Q24 of a memory cell, of which the data input and output terminals are connected with the pair of data lines D0, $\overline{D0}$, are switched on; therefore, the pair of data lines D0, $\overline{D0}$ and the pair of common lines CD, $\overline{CD}$ generate minute, complementary level changes away from the power supply voltage which is the previously attained precharge level, according to the information stored in the related memory cell MS. In this case, the difference of the levels gradually increase as the time passes. For example, according to the information kept in the related memory cell MC, a MOSFET Q21 is switched on, and a MOSFET Q22 is switched off, so the charges accumulated on one data line D0 and one common data line CD are discharged gradually through the MOSFETs Q23 and Q21, and the potentials of these lines are decreased gradually from the power supply voltage $V_{DD}$ of a prcharging level; in this case, the other data line $\overline{D0}$ and the other common data line $\overline{CD}$ are maintained at the precharging level.

When the level shift circuit LS and the sensing circuit SC are activated in response to selective operation of a word line W0, the level shift circuit LS receives, with driving MOSFETs Q27 and Q28, complementary level changes close to the above power supply voltage $V_{dd}$ that are generated on the common data lines CD, $\overline{CD}$, and shifts the complementary input levels by a value, respectively, ranged from 2 V to 2.5 V. The levels which are shifted in such a way are transformed to a level change close to an operating point Vc, where the sensing circuit SC has the most sensitive amplifying operation, so that the level change is supplied to input MOSFETs Q32 and Q33. In this way, the sensing circuit SC can set up amplifying output operation, without waiting for the level changes of a pair of data lines, having a large load capacity and a pair of common data lines CD, $\overline{CD}$ themselves to reach the vicinity of the operation point of the sensing circuit.

After the amplifying output operation of the sensing circuit SC is set up, in other words, after an amplifying output voltage Vout of the sensing circuit SC is set up in relation to the logic threshold level of an output inverter INV, the selective operation of the w. 1 line W0 ends with the timing (time $t_3$) before the pair of data lines D0, $\overline{D0}$ and the pair of common data lines CD, $\overline{CD}$ in themselves have level changes that reach the vicinity of the operation point of the sensing circuit SC. Therefore, level changes of the pair of data lines D0, $\overline{D0}$ and of the pair of common data lines CD, $\overline{CD}$, are limited to those of the vicinity of the power supply voltage $V_{DD}$.

If in a predetermined timing ($t_4$) that in synchronous with external clocks not shown the precharging signal $\phi p0$ is changed to a low level again, the pair of data lines D0, $\overline{D0}$ and the pair of common data lines CD, $\overline{CD}$ start to be charged to the power supply voltage $V_{dd}$ with the operation of the precharging MOSFETs Q1, Q2. At the succeeding time $t_5$, a sense amplifying signal $\phi$sa moves to a low level so that the sensing circuit SC and the level shift circuit LS become inactive, and the above MOSFET Q15 is switched on, and therefore an output voltage Vout of the sensing circuit SC is initialized to a high level to prepare for the next operation of memory cycles.

Figure 3:
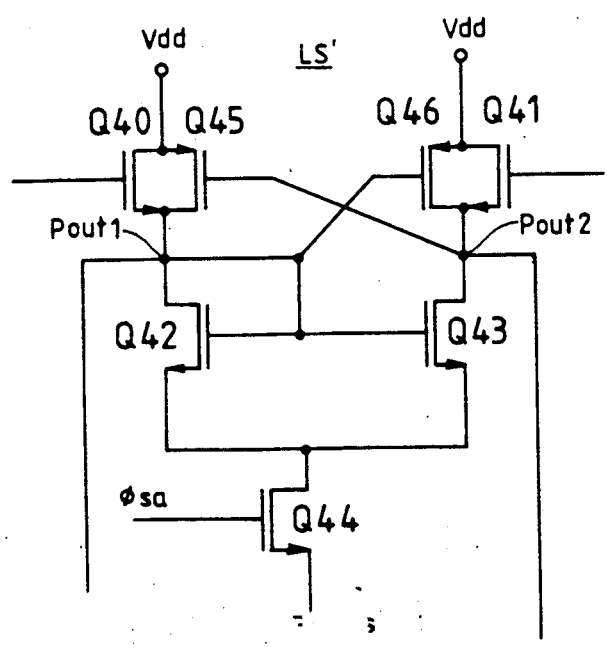
FIG. 3 is an example of a level shift circuit that can magnify and output complementary changes of an input voltage.

FIG. 3 illustrates an example of a level shift circuit that magnifies and outputs complementary changes of an input voltage. The level shift circuit LS' shown in the figure can be used instead of the above mentioned level shift circuit LS for the SRAM of FIG. 1.

The mutual conductance of MOSFET loads Q45 and Q46 is smaller than that of driving MOSFETs Q40 and Q41. That is, when driving MOSFETs Q40 and Q41 have complementary changes of the switching-on resistances, the MOSFET loads Q45 and Q46 increase changes of a current flowing through each source follower circuit on the basis of an output voltage of the other source follower circuit.

Figure 2:
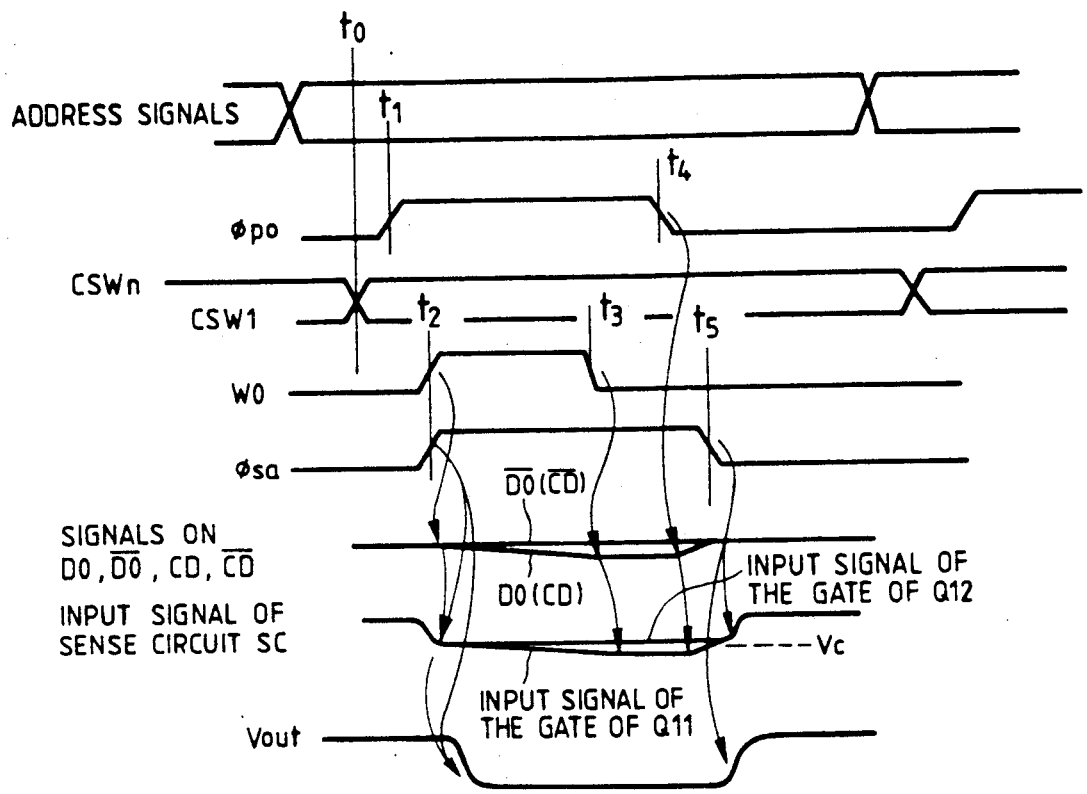
FIG. 2 illustrates timing charts to explain the data read-out operation of the SRAM shown in FIG. 1.
Figure 4:
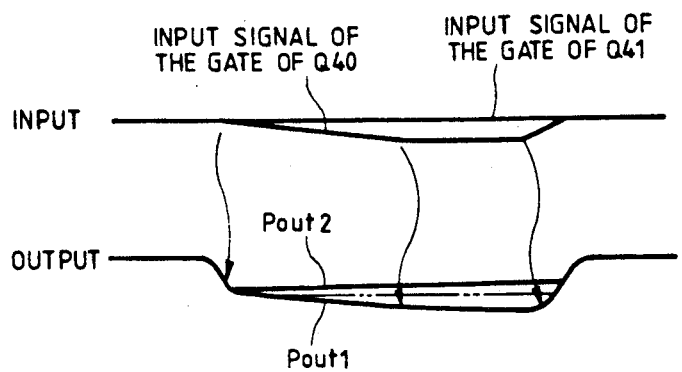
FIG. 4 illustrates the relation between an input and an output of the level shift circuit shown in FIG. 3.

For example, as shown in FIG. 4 that corresponds to a part of FIG. 2, when a gate input voltage of one driving MOSFET Q40 is lower than that of the other MOSFET Q41, and when an input voltage change increases with the time lapse the MOSFET load Q46 of which the gate electrode is connected with an output terminal Pout1 having the lower level, increases gradually the current being supplied to the other output terminal Pout2 and the output level of the related output terminal Pout2 increases gradually. On the other hand, the MOSFET load Q45 of which the gate electrode is connected with the output terminal Pout2 having an increasing level, decreases gradually the current being supplied to the output terminal Pout1, or the MOSFET load Q45 itself is cut off when the level of the Pout2 is sufficiently increased; therefore, an output level of the related output terminal Pout1 is gradually decreased according to a gate input voltage of the driving MOSFET Q40. In this way, the output change caused by an input change of the level shift circuit LS' is shifted as the straight line instead of the chained line that indicates the high-level output changes of the level shift circuit LS in FIG. 1. Therefore, as the level shift circuit LS' can generate complementary-shifted outputs by gradually increasing a difference of levels of complementary input voltages, amplifying operation of the sensing circuit SC is set up with a far higher speed.

Figure 5:
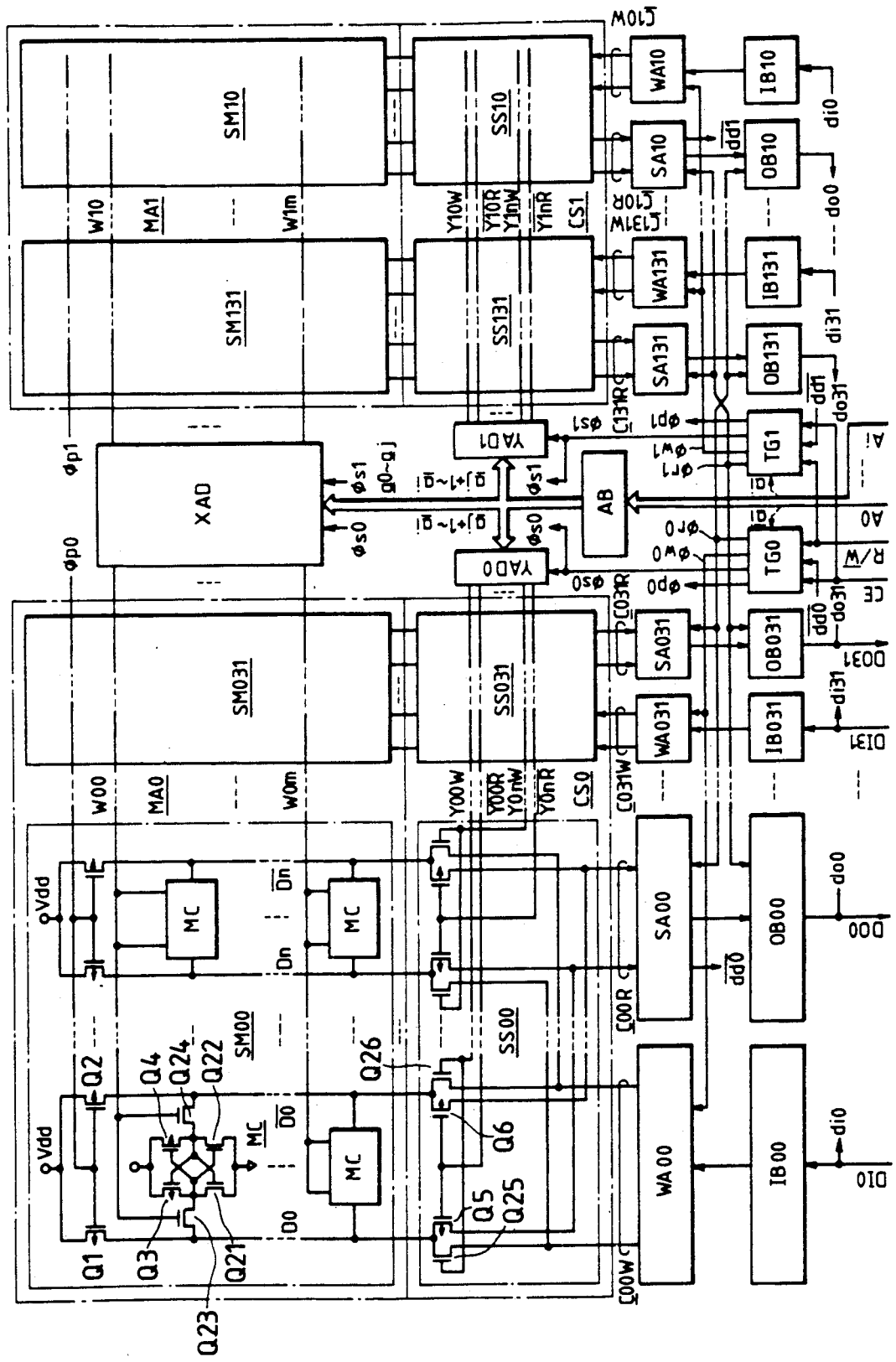
FIG. 5 is a block diagram of an embodiment of a clocked-static RAM to which the circuit of FIG. 1 is applied.

FIG. 5 shows a block diagram of an embodiment of a clocked-static RAM according to the invention.

Figure 6:
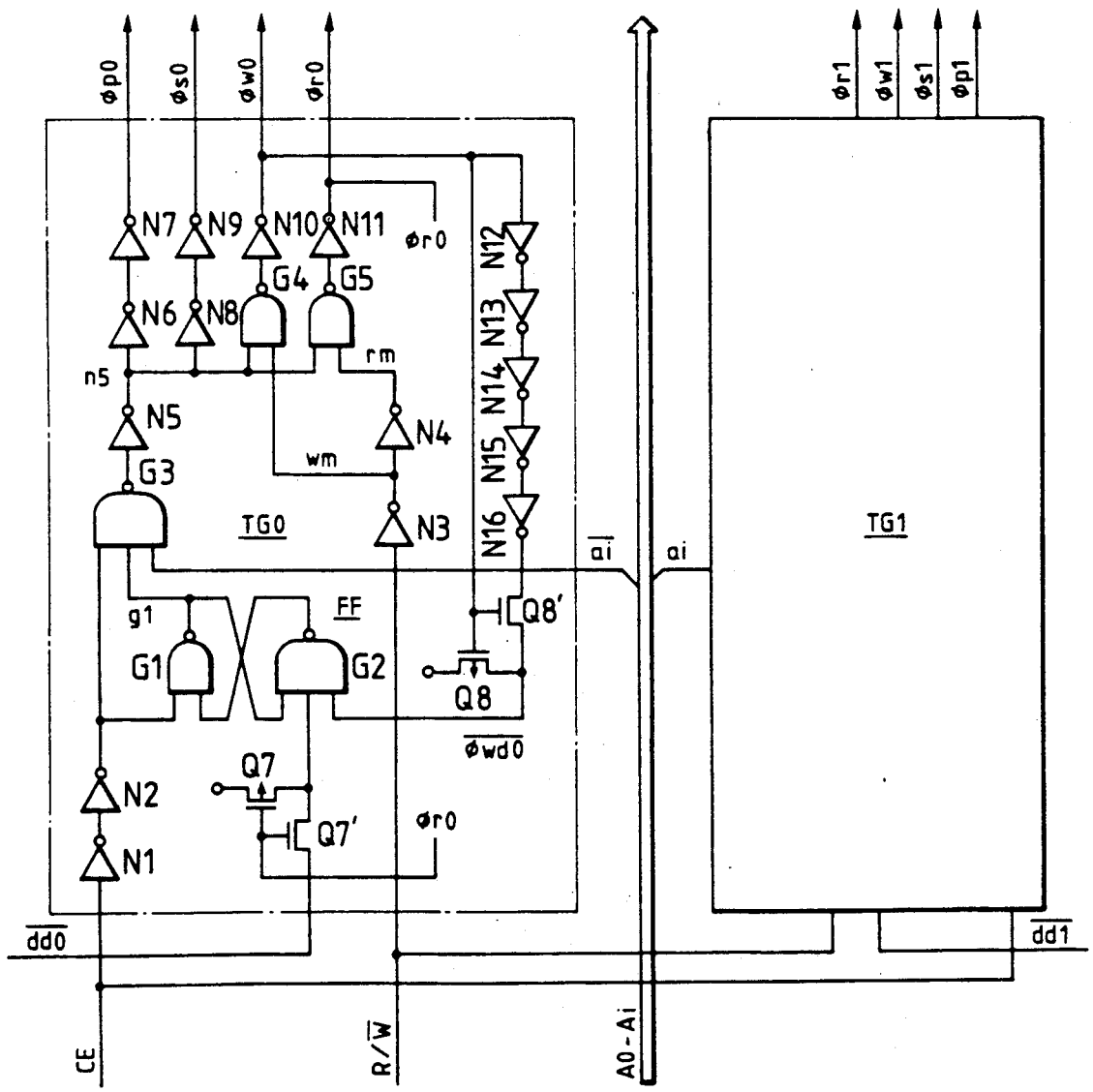
FIG. 6 is a circuit diagram of an embodiment of the timing generation circuit that is used for the clocked-static RAM of FIG. 5.

The essential part of the circuit shown in FIG. 1 is applied to the circuit of FIG. 5, and therefore some of the symbols used for each element of FIG. 1 are used commonly for FIG. 5. FIG. 6 shows a circuit diagram of an embodiment of the timing generation circuit that is included in the clocked-static RAM of FIG. 5 and FIG.

7 shows the timing charts of an embodiment of the clocked-static RAM of FIG. 5. According to these figures and the embodiment, construction and operation of a clocked-static RAM will be explained.

The clocked-static RAM of this embodiment although not particularly limited to it is included in a large scale integrated circuit. The large scale integrated circuit although not particularly limited to it includes two or more on-chip RAMs that have the same features as the clocked-static RAM of this embodiment, and is therefore used to construct a digital device, for example a microcomputer. In the digital device, a clocked-static RAM, although not particularly limited to it is used as temporary memory like a register file. Each circuit element shown in FIG. 1 and FIG. 5 and circuit elements that construct each block, although not particularly limited thereto, is the same for the other circuit elements of the large scale integrated circuit not shown in the figure, and formed on a semiconductor substrate, for example, a single-crystal silicon. In FIG. 5 and FIG. 6, MOSFETs having an arrow on the channel are of P-channel type, distinguished from N-channel MOSFETs which are illustrated without an arrow.

A clocked-static RAM, although not particularly limited to it, is considered as a RAM of multi-bit construction that inputs and outputs simultaneously 32-bit storage data; and the RAM has the fundamental construction of two memory arrays MA0 and MA1 arranged on the greater part of a semiconductor substrate. The memory arrays MA0 and MA1 have no particular limitation, and are selectively operated according to an address signal Ai of the most significant bit, including 32 subordinate memory arrays SM00 to SM031, or SM10 to SM131, respectively, which are corresponding to each bit of storage data.

In FIG. 5, subordinate memory arrays SM00 to SM031, and SM10 to SM131, which construct memory arrays MA0 and MA1, have no limitation; but, as shown representatively by a subordinate memory array SM00 of FIG. 5, the above mentioned arrays include $m+1$ word lines W00 to W0m, or W10 to W1m, which are arranged in parallel in the horizontal direction, $n+1$ pairs of complementary data lines $\overline{D0}$ to $\overline{Dn}$ which are arranged in parallel in the vertical direction (here, complementary data line $\overline{D0}$, for example, means both non-inverting data line $D0$ and inverting data line $\overline{D0}$), and $(m+1)\cdot(n+1)$ static memory cells MC which are arranged on the intersecting points of these word lines and complementary data lines; respectively. The internal construction of the memory cell MC is the same as what is shown in FIG. 1.

Transmitting gates of $n+1$ memory cells MC that are arranged on the same line of memory array MARY, that is, gates of MOSFETs Q23, Q24 and so on, are commonly connected, respectively, with the corresponding word lines W00 to W0m, or W10 to W1m.

Figure 7:
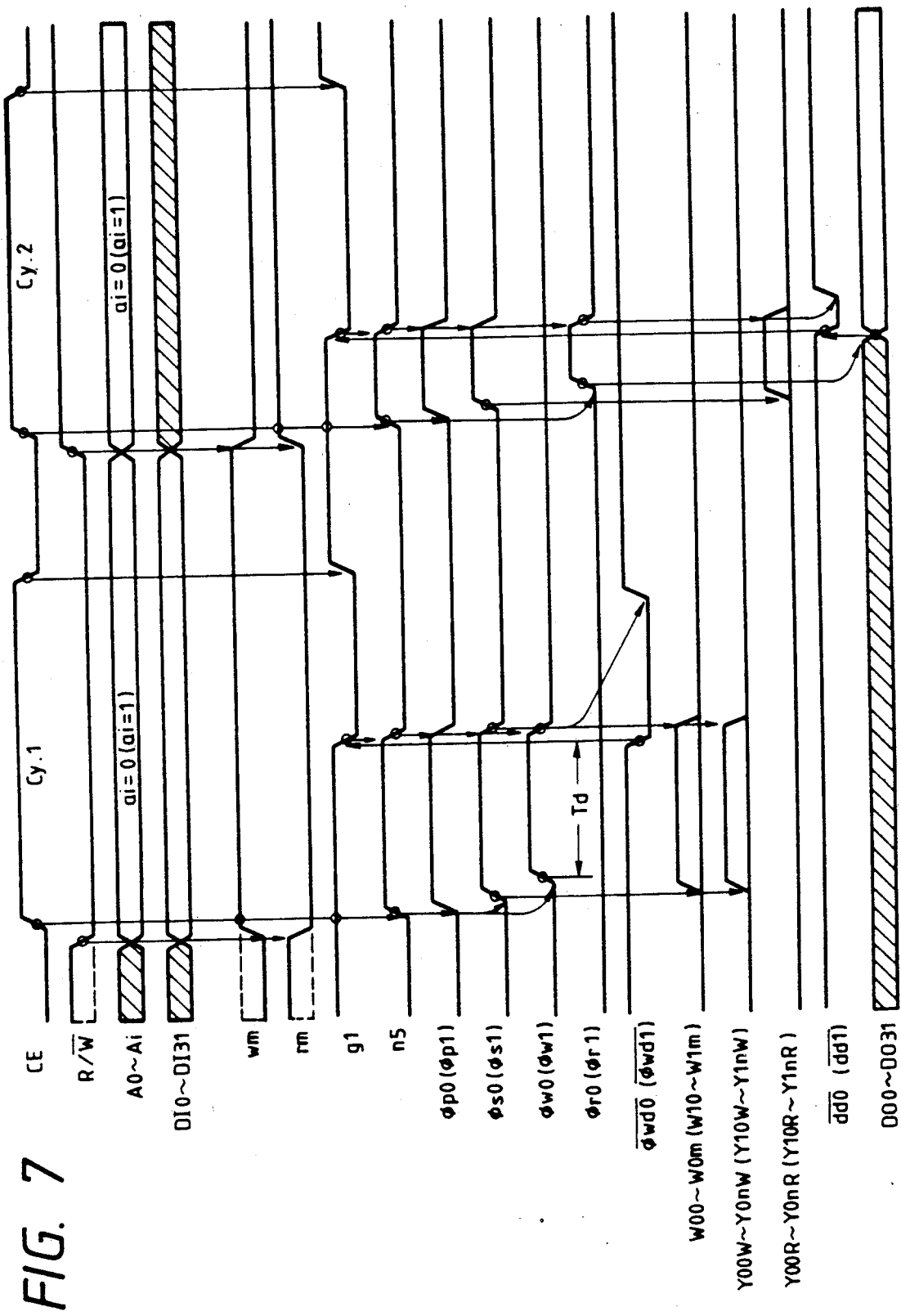
FIG. 7 illustrates the timing of the clocked-static RAM shown in FIG. 5.

The word lines W00 to W0m that construct subordinate memory arrays SM00 to SM031 are connected with an X address decoder XAD to be able to select by one word line an individual row of the memory array MA0. In the same manner, the word lines W10 to W1m constructing subordinate memory arrays SM10 to SM131 of a memory array MA1 are connected with an X address decoder XAD to be able to select by one word line an individual row of the memory array MA1. The X address decoder XAD is supplied with complementary, internal address signals a0 to e,uns/a/ j having $j+1$ bits from an address buffer $\overline{AB}$ (here, complementary internal address $\overline{a0}$, for example, means both non-inverting internal address signal a0 and inverting internal address signal $\overline{a0}$) and is supplied with timing signals $\phi s0$ and $\phi s1$ from timing generation circuits TG0 and TG1. Here, the timing signals $\phi s0$ and $\phi s1$ are, as shown in FIG. 7, usually in a low-level; and when the clocked-static RAM is in the selective condition, they are moved to a high level by the predetermined selective timing. And they are returned to a low level, after a certain time is passed from the start of writing operation, or when reading operation ends and the logic level of an output signal is set up. This will be explained later.

The X address decoder XAD is selected to be in an operating condition if the above mentioned timing signal $\phi s0$ or $\phi s1$ becomes high level. In this operating condition, the X address decoder XAD decodes the above complementary, internal address signals $\underline{a0}$ to $\underline{aj}$, and makes the corresponding word line of the memory array MA0 or MA1 a high level selectively. As described above, when a certain period is passed from the start of writing operation, or when reading operation ends and the logic level of an output signal is set up, the above timing signals $\phi s0$ and $\phi s1$ become low level, and the operation of the X address decoder XAD stops. As a result, all of the word lines W00 to W0m, and W10 to W131 are placed in the non-selective condition of low level. In this way, not only an operating current of the X address decoder XAD is decreased, but an operating current of each memory cell MC of memory arrays MA0 and MA1 is decreased.

Now, the complementary data lines $\overline{D0}$ to $\overline{Sn}$ that construct subordinate memory arrays $\overline{SM00}$ to $\overline{SM031}$, and SM10 to SM131, which are not necessarily limited to that illustrated in FIG. 5, are connected with the power supply voltage of the circuit through the corresponding P-channel, precharging MOSFETs Q1, Q2 etc. on one hand, and are connected with the corresponding subordinate column switches SS00 to SS031, or SS10 to SS131 of a column switch CS0 or CS1, for example the corresponding switching MOSFETs Q5-Q25 and Q6-Q26, on the other hand.

The gates of precharging MOSFETs Q1, Q2 etc. are commonly supplied with timing signals $\phi p0$ or $\phi p1$ from a timing generation circuit TG0 or TG1. Here, the timing signals $\phi p0$ and p1 have no limitation, and are usually low level as shown in FIG. 7. But when a clocked-static RAM is in the selective condition, the timing signals $\phi p0$ and $\phi p1$ are moved to high level before the above timing signals $\phi s0$ or $\phi s1$ goes high. The signals $\phi p0$ and $\phi p1$ are returned to low level, when a certain period is passed from the start of writing operation, or when reading operation ends and the logic level of an output signal is set up, as is the same for the timing signals $\phi s0$ and $\phi s1$.

The precharging MOSFETs Q1, Q2 etc. are selectively switched on, when the clocked-static RAM becomes non-selective and the above timing signals $\phi p0$ and $\phi p1$ are low level wherein precharge of the non-inverting and inverting signal lines of the corresponding compelementary data lines $\underline{D0}$ to $\underline{Dn}$ to a high takes place, for example the power supply voltage of the circuit. When the clocked-static RAM is placed in the selective condition, and when the corresponding timing signal $\phi p0$ or $\phi p1$ shown above is made high level, the precharging MOSFETs Q1, Q2 etc. are switched off, and therefore the precharging operation of complementary data lines is stopped.

The column switches CS0 and CS1 have no particular limitation, and respectively include 32 subordinate column switches SS00 to SS031, or SS10 to SS131, respectively, which are disposed correspondingly with respect to subordinate memory arrays SM00 to SM031, or SM10 to SM131. These subordinate column switches although not particularly limited thereto include, as shown representatively by the subordinate column switch SS00 in FIG. 5, n+1 pairs of complementary switching MOSFETs Q5-Q25, Q6-Q26 etc. corresponding to the complementary data lines $\underline{D}0$ to $\underline{D}n$. Among them, switching MOSFETs of another side, for example Q25 and Q26 are commonly connected with the corresponding, writing, complementary, common data lines $\underline{C}00W$ to $\underline{C}031W$, or $\underline{C}10W$ to $\underline{C}131W$, respectively. The gates of these switching MOSFETs are commonly connected with each other and the corresponding data line selective signals Y00W to Y0nW, or Y10W to Y1nW are supplied from a Y address decoder YAD0 or YAD1, respectively. In the same manner, each of switching MOSFETs of another side, for example Q5-Q6 is commonly connected with the corresponding, reading, complementary, common data lines $\underline{C}00R$ to $\underline{C}031R$, or $\underline{C}10R$ to $\underline{C}131R$. The commonly connected gates of these switching MOSFETs are coupled to selectively receive corresponding, inverting data line selective signals $\overline{Y00R}$ to $\overline{Y0nR}$, or $\overline{Y10R}$ to $\overline{Y1nR}$ supplied from the above Y address decoder YAD0 or YAD1, respectively. Here, data line selective signals Y00W to Y0nW, and Y10W to Y1nW are normally at a low level and the signals are selected to a high level by a certain timing, when the clocked static RAM is in a selective condition. The inverting data line selective signals $\overline{Y00R}$ to $\overline{Y0nR}$, and $\overline{Y10R}$ to $\overline{Y1nR}$ are normally at a high level, and they are selected to a low level by a certain timing when the clocked-static RAM is in a selective condition.

When the corresponding, above mentioned data line selective signals Y00W to Y0nW, or Y10W to Y1nW are selected to a high level, switching MOSFETs Q25, Q26 etc. of the subordinate column switches SS00 to SS031 wherein SS10 to SS131 are switched on; and the complementary data lines $\underline{D}0$ to $\underline{D}n$ and the writing, complementary, common data lines $\underline{C}00W$ to $\underline{C}031W$, or $\underline{C}10W$ to $\underline{C}131W$ corresponding to the subordinate memory arrays SM00 to SM031, or SM10 to SM131 are in a connecting condition. As a result, 32 memory cells MC in all (one cell for each subordinate memory array) are selected simultaneously, and connected with the corresponding writing amplifiers WA00 to WA031, or WA10 to WA131, respectively. In the same manner, switching MOSFETs Q5, Q6 etc. of the subordinate column switches SS00 to SS031, and SS10 to SS131 are switched on if one of the corresponding, above mentioned inverting data line selective signals from $\overline{Y00R}$ to $\overline{Y0nR}$, or from $\overline{Y10R}$ to $\overline{Y1nR}$ is selected to be a low level wherein the corresponding complementary data lines $\underline{D}0$ to $\underline{D}n$ and the corresponding, reading, complementary, common data lines $\underline{C}00R$ to $\underline{C}031R$, or $\underline{C}10R$ to $\underline{C}131R$ of subordinate memory arrays SM00 to SM031, or SM10 to SM131 are placed in connecting condition. As a result, 32 memory cells in all (one memory cell for each subordinate memory array) are simultaneously selected, and connected, respectively, with the corresponding sense amplifiers SA00 to SA031, or SA10 to SA131.

Y address decoders YAD0 and YAD1, although not particularly limited thereto, are supplied commonly with complementary, internal address signals $\overline{a_{j+1}}$ to $\overline{a_i}$ having i-j bits from the above mentioned address buffer AB. The timing signal $\phi s0$ or $\phi s1$ is supplied from the timing generating circuit TG0 or TG1 to the address decoders YAD0 and YAD1, respectively, and at the same time, an internal control signal not shown in the figure is commonly supplied in order to specify an operation mode. The Y address decoders YAD0 and YAD1 are selectively placed in their operating condition, when the corresponding, above mentioned timing signal $\phi s0$ or $\phi s1$ becomes a high level. In this operating condition, the Y address decoders YAD0 and YAD1 decode the above mentioned, complementary, internal address signals $\overline{a_{j+1}}$ to $\overline{a_i}$. As a result, when the clocked-static RAM is in the writing mode, one of the corresponding, above mentioned data line selective signals from Y00W to Y0nW, or Y10W to Y1nW is selected to be a high level. When the clocked-static RAM has an operating condition in the reading mode, one of the corresponding above mentioned, inverting data line selective signals from $\overline{Y00R}$ to $\overline{Y0nR}$, or from $\overline{Y10R}$ to $\overline{Y1nR}$ is selected to be a low level. As mentioned above, when a certain period is passed from the start of a writing operation, or when a reading operating ends and the logic level of an output signal is set up, the above timing signals $\phi s0$ and $\phi s1$ are set to a low level and the operation of Y address decoders YAD0 and YAD1 is stopped. Therefore, all data line selective signals and inverting data line selective signals are in a non-selective condition, low level or high level. In this way, operating currents of the Y address decoders YAD0 and YAD1 are decreased, and operation to precharge each complementary data line can be started early.

Complementary, writing, common data lines $\underline{C}00W$ to $\underline{C}031W$, and $\underline{C}10W$ to $\underline{C}131W$ are connected with the corresponding output terminals of writing amplifiers WA00 to WA031, or WA10 to WA131, respectively. The input terminals of these writing amplifiers are connected with the output terminals of the corresponding data input buffers IB00 to IB031, or IB10 to IB131, respectively. The input terminals of the data input buffers IB00 to IB31 are connected with the input terminals of the corresponding data input buffers IB10 to IB131, respectively, and are supplied with the corresponding input data DI0 to DI31, respectively, through an not-shown data bus of a large scale integrated circuit. The writing amplifiers WA00 to WA031, and WA10 to WA131 are commonly supplied with a timing signal $\phi w0$ or $\phi w1$ from the corresponding timing generation circuit TG0 or TG1. Here, the timing signals $\phi w0$ and $\phi w1$ have no particular limitation, are normally kept low, and are selectively set to a high level during a certain timing when the clocked-static RAM becomes a selective condition in the writing mode. As will be explained later, the signals are returned to a low level when a certain period required for writing is passed from the start of writing operation.

Data input buffers IB00 to IB031, and IB10 to IB131 receive the above input data DI0 to DI31 when the clocked-static RAM is in the writing mode, and transmit the data to the corresponding writing amplifiers WA00 to WA031, or WA10 to WA131.

The writing amplifiers WA00 to WA031, and WA10 to WA131 are selected to be in an operating condition, when the clocked-static RAM is in the writing mode and when the above timing signal $\phi w0$ or $\phi w1$ is set to a high level. In this operating condition, writing amplifiers WA00 to WA031, and WA10 to WA131 have complementary writing signals, that is, writing data which are transformed from the corresponding above mentioned data input buffers IB00 to IB031, or IB10 to IB131, and the complementary writing signals are supplied to a selected memory cell MC of subordinate memory arrays SM00 to SM031, or SM10 to SM131 through the corresponding, writing, complementary, common data lines C00W to C031W, or C10W to C131W.

In this embodiment, timing signals $\phi w0$ and $\phi w1$ are returned to a low level, as mentioned above, after a certain period is passed from the start of writing operation, and therefore the whole operation of writing amplifiers WA00 to WA031, and WA10 to WA131 is stopped. In this way, the writing amplifiers WA00 to WA031, and WA10 to WA131 operate during the minimum period required so as to decrease the power consumption of clocked-static RAMs.

Complementary, reading, common data lines C00R to C031R, and C10R to C131R are connected with the input terminals of the corresponding sense amplifiers SA00 to SA031, or SA10 to SA131, respectively. The output terminals of these sense amplifiers are connected with the corresponding input terminals of data output buffers OB00 to OB031, or OB10 to OB131, respectively. Each of these sense amplifiers has the same internal construction as the sense amplifier SA shown in FIG. 1. The output terminals of data output buffers OB00 to OB031 are commonly connected with the corresponding output terminals of data output buffers OB10 to OB131, respectively. Their output signals are transmitted to the data bus of a large scale integrated circuit as output data DP0 to DO31. The sense amplifiers SA00 to SA031, and SA10 to SA131 are supplied commonly with a timing signal $\phi r0$ or $\phi r1$ from the corresponding timing generation circuit TG0 to TG1. The function of these timing signals $\phi r0$ or $\phi r1$ is the same as what is shown in FIG. 1. Data output buffers OB00 to OB031, and OB10 to OB131 are supplied commonly with the above timing signal $\phi r1$ or $\phi r0$ from the opposite timing generation circuit TG1 or TG0. Here, timing signals $\phi r0$ and $\phi r1$ have no particular limitation, and are usually low level but when the clocked-static RAM is in a selective condition of the reading mode, the timing signals are selected to a high level with a predetermined timing. It will be explained later that they are returned to a low level when the reading operation finishes and the logic level of an output signal of sense amplifiers SA00 to SA031, and SA10 to SA131 is set up.

When the clocked-static RAM is in the reading mode, and when the above timing signal $\phi r0$ or $\phi r1$ has a high level, sense amplifiers SA00 to SA031, and SA10 to SA131 are selected to be in an operating condition. In this operating condition, the sense amplifiers SA00 to SA031, and SA10 to SA131 amplify a reading signal that generates from a selected memory cell MC of subordinate memory arrays SM00 to SM031, or SM10 to SM131 through the corresponding reading, complementary, common data lines C00R to C031R, or C10R to C131R, and transmit the reading signal to the corresponding data output buffers OB00 to OB031, or OB10 to OB131.

In this embodiment, the timing signals $\phi r0$ and $\phi r1$ are returned to a low level, as mentioned above, when the reading operation ends and a low level of an output signal of each sense amplit is set up, and therefore the whole operation of the sense amplifiers SA00 to SA031, and SA10 to SA131 is stopped. In this way, the sense amplifiers SA00 to SA031, and SA10 to SA131 are in the operating condition for the minimum required period so as to decrease the power consumption of clocked-static RAMs.

When the clocked-static RAM is in the reading mode, data output buffers OB00 to OB031, and OB10 to OB131 take in a reading signal transmitted from the corresponding sense amplifiers SA00 to SA031, or SA10 to SA131, and send it to a data bus, not shown, of a large scale integrated circuit as output data DO0 to DO31.

By the way, the data output buffers OB00 to OB031, and OB10 to OB131, although not particularly limited thereto, include output latches to hold data for reading. These output latches take in instantly a reading signal amplified by the corresponding sense amplifiers SA00 to SA031, and SA10 to SA131, and hold it until the next reading operation begins. Needless to say, sense amplifiers SA00 to SA031, and SA10 to SA131 are selected to be in the operating condition according to an address signal of the most significant bit. Therefore, unless sense amplifiers of one group are in the operating condition continuously, data held in each output buffer are not cleared. In this way, for the clocked-static RAM of this embodiment, an opposite timing signal $\phi r1$ or $\phi r0$ is supplied to the data output before buffers OB00 to OB031, or OB10 to OB131 so as to clear the output latches of the data output buffers that belong to a group not in the operating condition.

Timing generating circuits TG0 and TG1 have no particular limitation, and are supplied commonly with a chip enable signal CE, and read/write signals R/$\overline{W}$ from another circuit of a large scale integrated circuit, and then supplied with an inverted, internal control signal $\overline{dd0}$ or dd1 from a sense amplifier SA00 or SA10. Here, the inverted, internal control signals dd0 and dd1 have no particular limitation, and are normally of high level; they are temporarily set to a low level when the clocked-static RAM is in a selective condition of the reading mode, and when a logic level of an output signal of the corresponding sense amplifier SA00 or SA10 is set up. In this embodiment, sense amplifiers SA00 and SA10 are so designed as to have a longer time of amplifying than that of other sense amplifiers SA01 to SA031, or SA11 to SA131. By distinguishing the logic-level setting-up of the sense amplifier SA00 or SA10, logic levels of all sense amplifiers SA00 to SA031, or SA10 to SA131 are decided to be set up.

The timing generation circuits TG0 and TG1 as exemplified by a timing generation circuit TG0 in FIG. 6, although not to be construed as being limited thereto, have the fundamental construction of a flip-flop circuit FF including NAND gates G1 and G2. One input terminal of the NAND gate G1 is connected with the output terminal of the NAND gate G2, and the other input terminal is supplied with the above mentioned chip enable signal CE through two inverter circuits N1 and N2 connected in series. On the other hand, the first input terminal of the NAND gate G2 is connected with the output terminal of the NAND gate G1, the second input of the NAND gate G2 is supplied with the above mentioned, inverted, internal control signal dd0 or dd1 through an N-channel MOSFET Q7', and supplied with the power supply voltage of the circuit through a P-channel MOSFET Q7. The gates of these MOSFETs Q7' and Q7 are commonly connected and supplied with the above timing signal $\phi r0$ or $\phi r1$. The third input of the NAND gate G2 is supplied with an inverted delay signal $\overline{\phi wd0}$ or $\overline{\phi wd1}$ of the above mentioned timing signal $\phi w0$ or $\phi w1$, through, although not to be construed as being limited thereto, a delay circuit that comprises five inverter circuits N12 to N16 connected in series and an N-channel MOSFET Q8' and then supplied with the power supply voltage of the circuit through a P-channel MOSFET Q8. The gates of these MOSFETs Q8' and Q8 are commonly connected, and are supplied with the above timing signal $\phi w0$ or $\phi w1$.

An output signal of an inverter circuit N2 namely a chip enable signal CE is also supplied to the first input terminal of a NAND gate circuit G3. The second input terminal of the NAND gate circuit G3 is supplied with an output signal g1 of the above NAND gate G1, and the third input of the NAND gate G3 is supplied with an inverted address signal $\overline{ai}$ or a non-inverted address signal ai of the most significant bit, selectively. The output signal of the NAND gate G3 forms an internal signal n5 after being inverted by an inverter circuit N5.

The output signal of the inverter circuit N5, that is, the internal signal n5, is transformed into the above mentioned timing signal $\phi p0$ or $\phi p1$ through two inverter circuits N6 and N7 that are connected in series, and supplied to the precharging MOSFETs Q1, Q2 etc. of a memory array MA0 or MA1, and the internal signal n5 is transformed into the above mentioned timing signal $\phi s0$ or $\phi s1$ through two inverter circuits N8 and N9 that are connected in series, in the same manner, and supplied to an X address decoder XAD and to a Y address decoder YAD0 or YAD1.

The output signal of the inverter circuit N5, that is, the internal signal n5 is also supplied to one input of each NAND gate G4 or G5. The other input terminal of the NAND gate G4 is supplied with an internal signal wm that is formed by inverting the read/write signals R/$\overline{W}$ by using an inverter circuit N3, and the other input terminal of the NAND gate G5 is supplied with an internal signal rm that is formed by inverting the above internal signal wm by using an inverter circuit N4. Needless to say, the above internal signal wm is selected to a high level when the read/write signals R/$\overline{W}$ are of low level, and when the clocked-static RAM is the writing mode. The internal signal rm is selected to a high level when the read/write signals R/$\overline{W}$ are a high level, and when the clocked-static RAM is in the reading mode. Therefore, the output signal of the above inverter circuit N5, that is, the internal signal n5, is transmitted to the inverter circuit N10 when the clocked-static RAM is in the writing mode, and supplied to the writing amplifiers WA00 to WA031, or WA10 to WA131 as the above mentioned timing signal $\phi w0$ or $\phi w1$. On the other hand, when the clocked-static RAM is in the reading mode, the internal signal n5 is transmitted to an inverter circuit N11, and supplied to the sense amplifiers SA00 to SA031, or SA10 to SA131 as the above mentioned timing signal $\phi r0$ or $\phi r1$.

In this embodiment, the above mentioned timing signals $\phi p0$, $\phi s0$, $\phi w0$ and $\phi r0$; or $\phi p1$, $\phi s1$, $\phi w1$ and $\phi r1$ are so designed as to have the timing shown in FIG. 7 if the circuit constants of the corresponding inverter circuits and NAND gates are properly adjusted.

When the chip enable signal CE has a low level and the clocked-static RAM has a non-selective condition, the output signal of an inverter circuit N2 has a low level; and the output signal g1 of the NAND gate G1 has a high level as shown in FIG. 7. As the timing signals $\phi p0$, $\phi s0$, $\phi w0$ and $\phi r0$, or $\phi p1$, $\phi s1$, $\phi w1$ and $\phi r1$ have a low level, MOSFETs Q7' and Q8' are switched off, and MOSFETs Q7 and Q8 are switched on. Therefore, the first, second and third input terminals of the NAND gate G2 have a high level, and its output terminal becomes low level. In this way, a flip-flop circuit FF has a reset condition with its output signal g1 of high level.

The clocked-static RAM is placed in the selective condition by changing the chip enable signal CE from low to high level. As shown in the cycle Cy.1 of FIG. 7, it is selected to be in the writing mode by changing read/write signals R/$\overline{W}$ to low level before the chip enable signal CE goes to high level, and the clocked-static RAM is supplied with (i+1)-bit address signals A0 to Ai from an address bus not shown, on a large scale integrated circuit, and supplied with 32-bit input data DI0 to DI31 through a data bus.

The timing generation circuits TG0 and TG1 of the clocked-static RAM have an internal signal wm of a high level and an internal signal rm of a low level when the read/write signals R/$\overline{W}$ are made low. When the chip enable signal CE becomes high level, an output signal of the NAND gate G3 is made low if the corresponding, inverting address signal $\overline{ai}$ or non-inverting address signal ai is high; and the corresponding output signal of an inverter circuit N5 namely an internal signal n5 is made high. As a result, timing signals $\phi p0$, $\phi s0$ and $\phi w0$ respond to the above mentioned inverting address signal $\overline{ai}$ of a high level, and timing signals $\phi p1$, $\phi s1$ and $\phi w1$ respond to the non-inverting address signal ai of a high level; the timing signals are made high by using the relation shown in FIG. 7 one after another.

In the clocked-static RAM, a high level of a timing signal $\phi p0$ or $\phi p1$ makes the precharging MOSFETs Q1, Q2 etc. of a memory array MA0 or MA1 switch off, wherein the precharging operation of the complementary data lines is stopped. As the timing signal $\phi s0$ or $\phi s1$ is made high, an X address decoder XAD and a Y address decoder, YAD0 or YAD1, are in an operating condition so as to start the selecting operation of the word lines and complementary data lines. Therefore, each memory cell is selected from each subordinate memory array of memory arrays MA0 or MA1, in other words, 32 memory cells MC are selected in total; and they are connected with the corresponding, writing amplifiers WA00 to WA031, or WA10 to WA131. These writing amplifiers are all in the operating condition when the timing signal $\phi w0$ or $\phi w1$ is made high, and therefore the input data DI0 to DI31 begin to be written into the selected 32 memory cells MC.

By the way, the timing signals $\phi w0$ and $\phi w1$ are supplied to the writing amplifiers WA00 to WA031, or WA10 to WA131 as mentioned above, and then supplied to the third input terminal of the NAND gate G2 as an inverted delay signal $\overline{\phi wd0}$ or $\overline{\phi wd1}$, through a delay circuit comprising inverter circuits N12 to N16. In this way, the timing signal $\phi w0$ or $\phi w1$ is made high level and when a predetermined delay time Td set in the above mentioned delay circuit is passed, an output signal of the NAND gate G2 moves to a high level. Here, the above delay time Td is so determined as to be the minimum required time for writing data into the writing amplifiers WA00 to WA031, or WA10 to WA131. When an output signal of the NAND gate G2 is of high level, a chip enable signal CE becomes high level, and therefore an output signal of the NAND gate G1 is made low so as to make the output signal of the inverte N5 namely the internal signal n5 low. In this way, the timing signals φp0, φs0 and φw0 or φp1, φs1 and φw1 are moved to a low level at the same time. As a result, each address decoder and each writing amplifier are returned to the non-selective condition, and the precharging MOSFETs Q1, Q2 etc. start to precharge the complementary data lines.

By the way, when the read/write signals are moved to a high level before the chip enable signal CE changes to a high level as shown in the cycle Cy.2 of FIG. 7, the clocked-satic RAM is placed in the reading mode. At that time, as the read/write signals R/$\overline{W}$ is set to a high level in the timing generation circuits TG0 and TG1 of the clocked-static RAM, an internal signal rm is at first made high, and then an internal signal wm is made low. And, when the chip enable signal CE is set to a high level, an output signal of the NAND gate G3 is moved to a low level if the corresponding, inverted address signal $\overline{ai}$ or non-inverted address signal ai is in a high level, and therefore the output signal of the corresponding inverter circuit N5 namely the internal signal n5 goes to high. As a result, timing signals φp0, φs0 and φr0 respond to the high level of the above mentioned, inverting address signal $\overline{ai}$, and timing signals φp1, φs1 and φr1 respond to the high level of the non-inverted address signal $\overline{ai}$, i.e. so the timing signals are set to a high level one after another, having a certain relation of timing.

In the clocked-static RAM, at first the precharging operation of the complementary data lines is stopped, as is the same for the cycle Cy.1, and then the specified, 32 memory cells MC are connected with the corresponding sense amplifiers SA00 to SA031, or SA10 to SA131. These sense amplifiers are all placed in the operating condition, simultaneously, when the timing signal φr0 or φr1 goes to high; and then the reading signal generated from the selected, 32 memory cells MC begins to be amplified.

By the way, when the sense amplifiers complete the sensing and amplification of the reading signal so as to thereby set up their output signals, an output signal of the sense amplifier SA00 or SA10 namely an inverted, internal control signal dd0 or dd1 is set to a low level, as is already described before. At this time, in the timing generation circuit TG0 or TG1 of the clocked-static RAM, a MOSFET Q7' is switched on, and a MOSFET Q7 is switched off. Therefore, an output signal of the NAND gate G2 moves to a high level in response to the low level of the inverted, internal control signal $\overline{dd0}$ or $\overline{dd1}$. In this way, like the Cy.1 described before, timing signals φp0, φs0 and φr0 or φp1, φs1 and φr1 are all moved to a low level at the same time. As the result, each address decoder and each sense amplifier are placed in the non-operating condition wherein the complementary data lines begin to be precharged by the precharging MOSFETs Q1, Q2 and so on.

So, when the clocked-static RAM is placed in the selective condition in this embodiment, at first 32 memory cells that are specified by each address decoder, are selected and connected with the corresponding writing amplifier or sense amplifier. When a predetermined time Td is passed from the start of the writing operation performed by these writing amplifiers, or when the amplifying operation of the sense amplifiers is completed and the logic levels of their output signals are set up, each address decoder, writing amplifier and sense amplifier are cleared from the operating conditions, and the precharging operation of the complementary data lines is started by precharging MOSFETs. The time it takes to complete the amplifying operation can differ for each sense amplifier of SA00 to SA31. As shown in FIG. 8, an OR gate OGA can be used for generating a control signal that is supplied to the timing signal generation circuit TG0, after the inverted, internal control signals $\overline{dd01}$ to $\overline{dd031}$ from every sense amplifier are all changed to a low level. Moreover, in the clocked static RAM of this embodiment, the timing generation circuits which generate each timing signal, respectively, corresponding to the distributed memory arrays are such so as to shorten the critical path of the timing system employed. As a result, the operating current for both the reading and writing modes of the clocked-static RAM is decreased without adversely influencing its high-speed operation, and therefore its power consumption can be kept low.

As mentioned above, the clocked static RAM of this embodiment is included in a large scale integrated circuit and is characterized as a RAM of a multi-bit construction that inputs and outputs 32-bit storage data at the same time. When the clocked-static RAM is in the selective condition, 32 pairs of complementary data lines of a memory array are all placed in the selective condition simultaneously. Therefore, in this embodiment, loads of complementary data lines are decreased, thereby reducing the lower power consumption, by splitting up a memory array into two parts. The clocked-static RAM includes an X address decoder for both of the memory arrays, and Y address decoders YAD0 and YAD1, each one corresponding to a memory array. For each memory array, the clocked-static RAM includes 32 writing amplifiers WA00 to WA031, WA10 to WA131 and 32 sense amplifiers SA00 to SA031, and SA10 to SA131. In this embodiment, after a certain period of time from the start of a writing operation, or if a logic level of an output signal is set up after the reading operation is completed, operation of each address decoder, writing amplifier and sense amplifier is stopped, and the precharging operation for each complementary data line pair is started. A timing generation circuit to generate each kind of timing signal needed to control the various modes of operation of the clocked-static RAM is prepared for two memory arrays to shorten the critical path of the timing system. Therefore, the clocked-static RAM of this embodiment can result in a low power consumption without having an adverse effect on its high-speed operation.

In the embodiment described above, a clocked-static memory generates internal clocks having a time width that is necessary for the circuit operation, and the circuit is in the waiting condition when it is not being operated, and therefore its power consumption is decreased considerably. It is also possible to detect a bad memory that cannot be operated in a certain, prescribed time by the above mentioned internal clock. So, even if a rough timing condition is applied to external control signals that are supplied to memory, a precise inspection of AC characteristics can be done and therefore, when the present invention is applied to an on-chip memory embedded in a chip, AC characteristics can be accurately tested for on-chip memory which is difficult to test.

FIG.9 shows an example of the sense amplifier SA00 that is shown in FIG. 5. This sense amplifier includes a precharging circuit PC, a level shift circuit LS, sense cuits SCP and SCN, and an output latch OL. The 'el shift circuit LS and a part of the sense circuits have the same construction as the corresponding circuit shown in FIG. 1. The precharging circuit PC has a pair of P-channel MOSFETs Q7 and Q8. The gates of both the MOSFETs Q7 and Q8 are commonly connected and supplied with the above mentioned timing signal $\phi r0$ from a timing generation circuit TG0.

In this case, the MOSFETs Q7 and Q8 of the precharging circuit PC are switched on selectively in response to the timing signal $\phi r0$ having a low level. That is, the clocked static RAM is in the non-selective condition and, therefore, the corresponding complementary, common data lines $\underline{C00R}$ are precharged to a high level, for example the power supply voltage of a circuit. The level shift circuit LS has the same construction as that of FIG. 1. Source voltages of MOSFETs Q27 and Q28 are supplied to the differential sense circuits SCP and SCN as complementary reading signals sd0 and $\overline{sd0}$. The differential sense circuit SCN has the same construction as the differential sense circuit SC shown in FIG. 1. The differential circuit SCP has fundamentally the same construction as the sense circuit shown in FIG. 1, but its connection is different from FIG. 1 because a signal $\overline{dp0}$ having the reverse phase of an output signal $\overline{dn0}$ of the sense circuit SNC is to be generated.

Furthermore, one input of an AND gate AG is supplied with the above mentioned timing signal $\phi r0$ from the timing generation circuit TG0, and the other input terminal of the AND gate AG is supplied with an internal control signal rm. Here, the internal control signal rm is selected to a high level when the clocked-static RAM is in the selective reading condition. As the result, an output signal of the AND gate AG, namely a timing signal $\phi sa$, is selected to be in a high level state when the clocked-static RAM is in the selective reading mode and the above mentioned timing signal $\phi r0$ becomes a high level.

As a result, the level shift circuit LS is set to the selective operating condition because the clocked-static RAM is in the selective reading condition wherein the above timing signal $\phi sa$ has a high level. At this time, the gates of the MOSFETs Q27 and Q28 of the level shift circuit LS are supplied with a certain reading signal through the complementary common data lines C00R.

The gates of MOSFETs Q32, Q33, Q35 and Q36 are supplied, respectively, with the output signals of the above level shift circuit LS, that is, the complementary reading signals sd0 and $\overline{sd0}$. The gates of the MOSFETs Q31, Q34 and Q37 are supplied with the above timing signal $\phi sa$.

The drain of MOSFETs Q35 and Q33 is connected with an input terminal of CMOS inverter circuits N2 and N3, respectively. Between the input terminals of the inverter circuits N2, N3 and the power supply voltage of the circuit, P-channel presetting MOSFETs Q13 and Q14 are connected each having its gate connected to the output of AND gate AG so as to receive the above mentioned timing signal $\phi sa$. Output signals of the inverter circuits N2 and N3 are non-inverted, internal output signals dp0 and dn0, respectively.

When the clocked-static RAM is in the non-selective condition or writing mode, and when the above mentioned timing signal $\phi sa$ has a low level, driving MOSFETs Q34 and Q37 of the differential sense circuits SCP and SCN are switched off, and presetting MOSFETs Q13 and Q14 are switched on. Therefore, both differential sense circuits SCP and SNC are placed in the non-operating condition and therefore the drain potentials of MOSFETs Q35 and Q33, that is, the inverted, internal output signals dp0 and dn0, respectfully, are placed at an undefined level condition. However, as presetting MOSFETs Q13 and Q14 are switched on as mentioned above, these inverted, internal signals are all preset at a high level at about the power supply voltage of the circuit. As the result, output signals of the inverter circuits N2 and N3, that is, the non-inverted, internal output signals dp0 and dn0 are all set to a low level, and a current is prevented from flowing through the CMOS inverter circuits N2 and N3.

Also, when the clocked-static RAM is in the selective condition and reading mode, and when the above mentioned timing signal $\phi sa$ has a high level, the driving MOSFETs Q34 and Q37 are switched on, and the presetting MOSFETs Q13 and Q14 are switched off.

In the clocked-static RAM of this embodiment, a differential sense circuit SCO functions as the first sense circuit to confirm a logic 1 of the corresponding, reading signal. In the same manner, a differential sense circuit SCN of the unit sense amplifiers USA0 to USA31 functions as the second sense circuit to confirm a logic 0 of the corresponding, reading signal. The output latch OL includes a latch as the fundamental construction, where two CMOS inverter circuits N20 and N21 are cross-coupled. A commonly connected node of the input terminal of an inverter circuit N20 and the output terminal of an inverter circuit N21, forms an inverting, input and output node of the output latch OL, and is connected with the power supply voltage and the ground voltage, respectively, through N-channel MOSFETs Q38 and Q40. The gate of the MOSFET Q38 is supplied with an output signal of the inverter circuit N3, that is a non-inverted, internal output signal dn0 and the gate of the MOSFET Q40 is supplied with an output signal of the inverter circuit N2, that is, a non-inverted, internal output signal dp0. In the same manner, a commonly connected node of the output terminal of the inverter circuit 20 and the input terminal of the inverter circuit 21 forms a non-inverting input and output node of the output latch OL, and is connected with the power supply voltage and the ground potential, respectively, through N-channel MOSFETs Q39 and Q41. The gate of the MOSFET Q39 is supplied with an output signal of the inverter circuit N2, that is, a non-inverted, internal output signal dp0; and the gate of the MOSFET Q41 is supplied with an output signal of the inverter circuit N3, that is, a non-inverted, internal output signal dn0. A potential of the non-inverting, input and output node of the output latch OL is transmitted to a data output buffer OB00 as a non-inverted, internal output signal rd0. An output signal ds0 is inverted and supplied to a timing generation circuit TG as an internal control signal $\overline{dd0}$.

In the embodiment shown in FIG. 9, there are provided, separately, a differential circuit SCP to detect a reading signal of a logic 1 level, and a differential sense circuit SCN to detect it as a logic 0 level; however, these differential sense circuits can be combined as a single differential sense circuit SC" shown in FIG. 10. In FIG. 10, P-channel MOSFETs Q15 and Q17, and N-channel MOSFETs including Q42 to Q45 correspond, respectively, to the P-channel MOSFETs Q11 and Q10, and to the N-channel MOSFETs Q32, Q35, Q33 and Q36, which are all shown in FIG. 9. A P-channel MOSFET Q16 is so constructed as to combine P-channel MOSFET Q9 and Q12 shown in FIG. 9; and an N-channel MOSFET Q46 can be formed by combining the N-channel MOSFETs Q34 and Q37 of FIG. 9.

Figure 11:
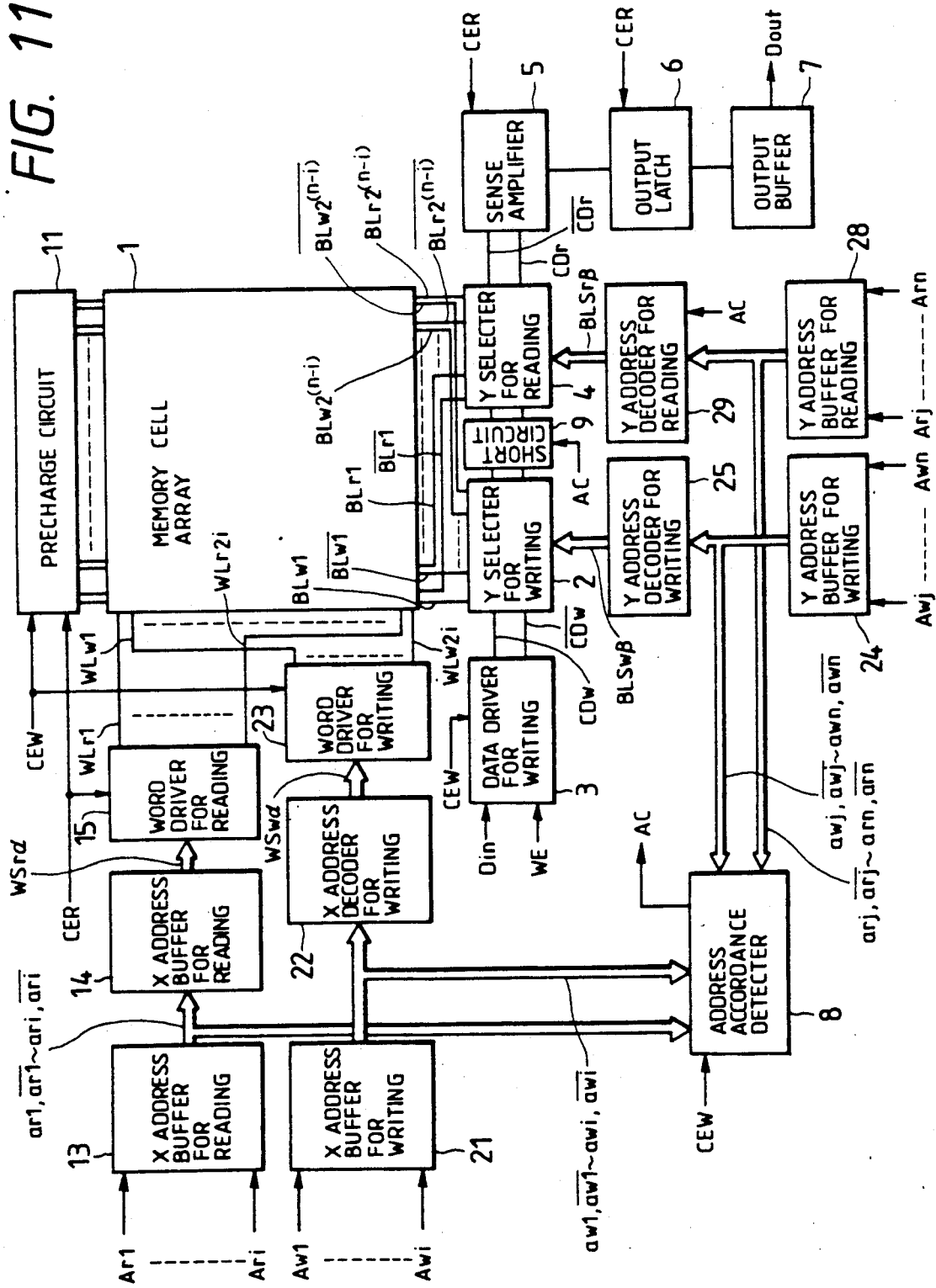
FIG. 11 is a block diagram showing the entire 2-port RAM to which the inventive circuit of FIG. 1 is applied.

FIG. 11 shows a block diagram of 2-port RAM according to an embodiment of the present invention. The 2-port RAM shown in the figure, although not specifically limited thereto, is formed on a semiconductor substrrate, such as single-crystal silicon by using known integrated circuit manufacturing technology.

Now, an outline of a two-port RAM will be explained according to the invention. A memory cell included in a memory array 1 is so constructed that a writing transfer gate and a reading transfer gate are connected with data input and output terminals of a static latch circuit; in this case, a writing operation or reading operation can be performed independently and asynchronously, by using the writing system that connects the memory cell with a writing transfer gate through a writing bit line, and by using the reading system that connects the memory cell with a reading transfer gate through a reading bit line.

According to this embodiment, the writing system is constructed with a Y-selector for writing 2, which controllably selects a bit line to be conductive with writing, common data lines CDw and $\overline{CDw}$; a data drive for writing 3, which drives the writing common data lines CDw and $\overline{CDw}$ to complementary levels according to writing data Din; and so on. The reading system is construced with a Y-selector for reading 4, which controllably selects a reading bit line to be conductive with reading, common data lines Cdr and $\overline{CDr}$; a sense amplifier 5 which detects a potential difference of the reading, common data lines CDr and CDr; an output latch circuit 6 to store an output signal of the sense amplifier 5; an amplifier buffer circuit 7 and so on. For the internal construction of the sense amplifier 5, for example, the circuit construction of a sense amplifier SA shown in FIG. 1 and a sense amplifier SA00 shown in FIG. 9 can be used. Operation timing and operation cycles for the reading and writing systems, although not specifically limited thereto, are fundamentally regulated by a reading clock signal CER for the reading operation and by a writing clock signal CEW for the writing operation. The reading clock CER and the writing clock CEW can be considered as a chip enable signal in clock synchronizing RAM. The reading clock signal CER and the writing clock signal CEW are asynchronous clock signals, and their phase relationship is determined by the conditions to supply them and the internal and external delay conditions. Therefore, it is generally considered that a reading cycle and a writing cycle wholly or partially overlap each other; in a such a case, a reading and a writing operation can be performed for the same memory, with the same or partially overlapped timing.

With respect to this point, a multi-port RAM according to this embodiment has an address accordance detector 8, which detects the accordance of writing addresses AW1 to awn and reading addresses AR1 to Arn, and, in response to this, provides writing data that are supplied to the writing system externally, to the reading common data lines CDr and $\overline{CDr}$ of the reading system, directly, through a short circuit 9 that is considered as a transmitting means. The writing information that is provided to the reading, common data lines CDr and $\overline{CDr}$ through a short circuit 9, is supplied to a sense amplifier 5. In this way, information supplied to the reading system is read out externally with a high speed if the priority of writing is actually satisfied and a memory cell to be accessed can be used for writing as well as for reading.

So, even if the same memory performs reading and writing operation in the same or partially overlapped timing, the reading speed of the data accessed is not decreased. Therefore a 2-port RAM can be used for high-speed access without concern that the reading and writing should not be done at the same time for the same memory cell.

Figure 12:
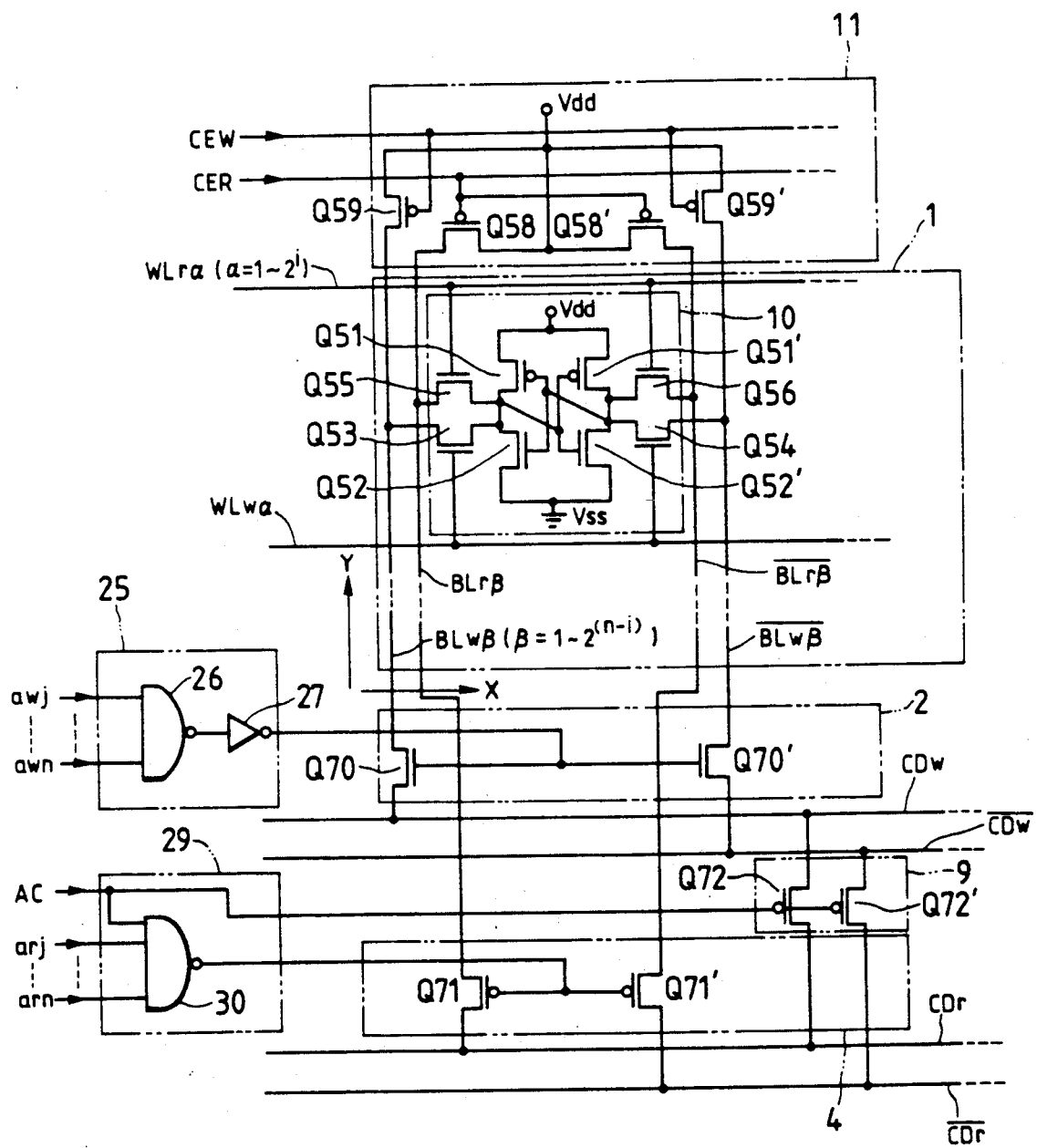
FIG. 12 is a circuit diagram illustrating the essential part from the read-out to writing system of the 2-port RAM memory cell shown in FIG. 1.

Now, details of the 2-port RAM will be explained. Details of the above mentioned memory array 1 are shown in FIG. 12.

A memory cell 10, although not limited thereto, has as a fundamental construction a static latch circuit of complementary MOS (simply described as CMOS, hereafter). The static latch circuit has a pair of CMOS inverter circuits, each of which is construction with P-channel MOSFETs Q51 and Q51', or N-channel MOSFETs Q52 and Q52'; in this case, each input terminal of the CMOS inverter circuits is cross-coupled with the output terminal of the other CMOS invertor.

Each connecting node of the above mentioned MOSFETs Q51, Q52, and Q51', Q52' is connected with two pairs of N-channel MOSFETs Q53, Q55, or Q54, Q56. The MOSFETs Q53 and Q54 are considered as a writing transfer gate, and the MOSFETs Q55 and Q56 are considered as a reading transfer gate. FIG. 12 shows a representative memory cell, but actually, two or more memory cells 10 are arranged in the X and Y directions to form a matrix.

In the memory cell 10 arranged to form a matrix, the gate electrodes of the MOSFETs Q53 and Q54 that construct a writing transfer gate, are connected with a writing word line WLw$\alpha$($\alpha$=1~2i) for every X direction; and the gate electrodes of the MOSFETs Q55 and Q56 that construct a reading transfer gate, are connected with a reading word line WLr$\alpha$ for every X direction. And one of the source and drain electrodes of MOSFETs Q53, Q54 that construct a writing transfer gate of the matrix-arranged memory cell 10, is connected with each of writing bit lines BLw$\beta$ and $\overline{BLw\beta}$($\beta$=1~2[n−i]) for every Y direction; in the same manner, one of the source and drain electrodes of MOSFETs Q55 and Q56 that construct a reading transfer gate, is connected with each of reading bit lines BLr$\beta$ and $\overline{BLr\beta}$ for every Y direction.

A selective control of the above mentioned reading word lines WLr1 to WLr2 is done by an X address buffer 13, a reading X-address decoder 14, and a reading word driver 15, all of which are shown in FIG. 11.

Figure 13:
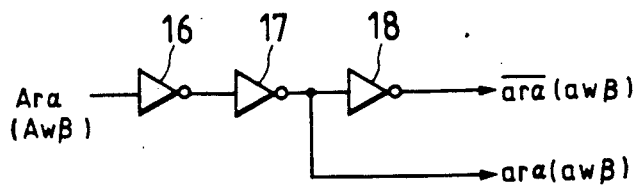
FIG. 13 illustrates an example of an address buffer.

The reading X-address buffer 13 transforms reading address signals Ar1 to Ari into complementary address signals Ar1, $\overline{Ar1}$~ari, $\overline{ari}$, and supplied them to the X address decoder 14. FIG. 13 shows a construction of one bit of the related address buffer 13, where an address bit Ar$\alpha$ is inverted by using three-stage CMOS inverter circuits 16 to 18 connected in series so as to form an inverted bit $\overline{ar\alpha}$. A non-inverter bit can then be formed by using two-stage CMOS inverter circuits 16 and 17 connected in series.

The reading X-address decoder 14 decodes the complementary address signals ar1, $\overline{ar1}$~ari, $\overline{ari}$ that are supplied from the reading X-address buffer 13, and forms selective signals WSr1 to WRs2i so as to select one line from word lines WLr1 to WLr2i.

Figure 14:
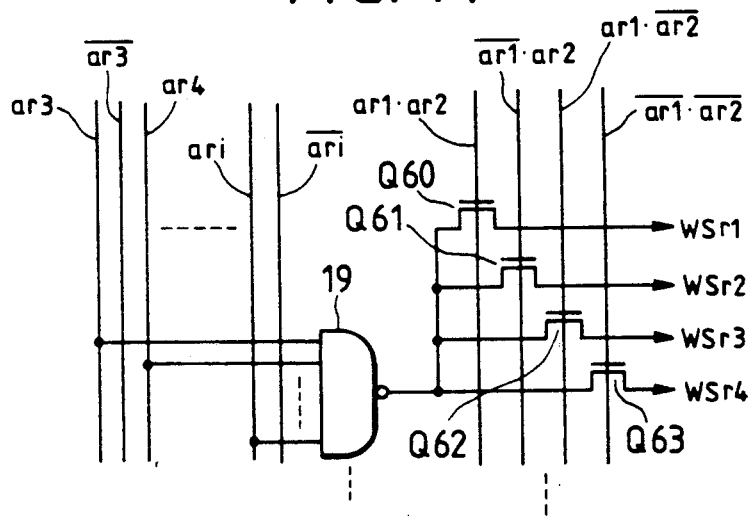
FIG. 14 illustrates an example of an address decoder.

FIG. 14 shows an example of the construction of the reading X-address decoder 14. The reading X-address decoder shown in FIG. 14, although not specifically limited thereto, includes a NAND gate 19 which is arranged with a pitch of every four of the word lines for reading, and each NAND gate 19 is supplied with a certain bit of complementary, internal address signals ar3, $\overline{ar3}$~ari, $\overline{ari}$, and therefore the output of one NAND gate 19 becomes a low level according to the combination of the levels of bits supplied. The output of one NAND gate 19 is used for block selection, where four word lines are considered as one unit. In order to select one line from four that are included in this one-unit block, the decoded result is used by taking an AND logic of low-order two bits ar1, $\overline{ar1}$, Ar2, and $\overline{ar2}$. For example, the output terminal of a NAND gate 19 is distributed to N-channel MOSFETs Q60 to Q63, which receive with their gate electrodes four kinds of signals obtained as a result of decoding. That is, a MOSFET Q60 is considered as an output gate of the word line selective signal WSr1 corresponding to the reading word line WLr1, a MOSFET Q61 is considered as an output gate of the word line selective signal WSr2 corresponding to the reading word line WLr2, a MOSFET Q62 is considered as an output gate of the word line selective signal WSr3 corresponding to the reading word line WLr3, and a MOSFET Q63 is considered as an output gate of the word line selective signal WSr4 corresponding to the reading word line WLr4.

The above mentioned reading word driver 15 drives a certain, reading word line to the selective level, for example a high level, on the basis of the word line selective signals Wsr1 to WSr2i that are supplied from the above reading X-address decoder 14.

Figure 15:
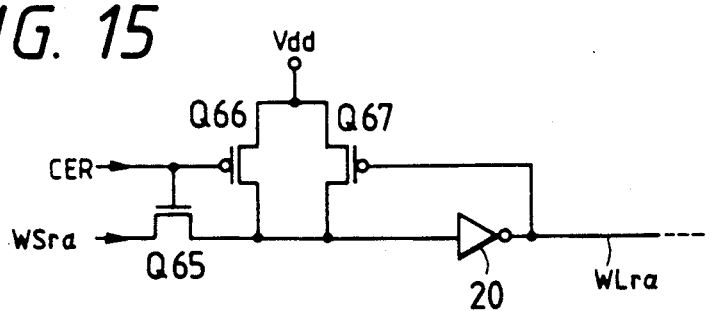
FIG. 15 illustrates an example of a word driver.

FIG. 15 shows an example of the construction of the reading word driver 15. The related word driver 15, although not specifically limited thereto, has a driving inverter circuit 20, which inverts and drives a word line selective signal SWrα through an n-channel gate MOSFET Q65, and its gate is supplied with a reading clock signal CER. The input of this driving inverter circuit 20 is connected with P-channel MOSFETs Q66 and Q67; in this case, Q66 forces the word lines to a non-selective level in a precharging period that is indicated by a low level of the reading clock CER and Q67 holds this condition until the driving timing is indicated by a word line selective signal WSrα.

The selective control of the above mentioned writing word lines WLw1 to WLw2i is done by an X address buffer for writing 21, an X address decoder for writing 22, and a word driver for writing 23.

The X address buffer for writing 21 transforms writing address signals Aw1[Awi into complementary address signals aw1, $\overline{aw1}$~awi, $\overline{awi}$ so as to output them, and can be constructed as shown in FIG. 13. The X address decoder for writing 22 decodes the complementary address signals aw1, $\overline{aw1}$~awi, $\overline{awi}$ supplied from the above mentioned X address buffer for writing 21, and generates writing word line selective signals WSw1 to WSw2i, which select a certain line from writing word lines WLw1 to WLw2i. For this selective logic, the same logic as shown in FIG. 14 can be used.

The word driver for writing 23 drives a certain writing word line to the selective level, for example a high level, on the basis of the word line selective signals WSw1 to WSw2i that are supplied from the X address decoder 22 for writing, and can be constructed as shown in FIG. 15.

In FIG. 11 and FIG. 12, a precharge circuit is shown with 11.

The precharge circuit 11 precharges the above mentioned complementary reading bit lines BLrβ to $\overline{BLrβ}$ and the complementary writing bit lines BLwβ to BLwβ to a power supply voltage $V_{DD}$ having a relatively high level. The precharge circuit 11 is so constructed that the drain electrodes of a pair of P-channel precharge MOSFETs Q58 and dQ58', with their source electrodes connected with the power supply voltage $V_{DD}$, are connected with one end of each reading bit line BLrβ or BLrβ, and that the drain electrodes of a pair of P-channel precharge MOSFETs Q59 and Q59', with their source electrodes connected with the power supply voltage $V_{DD}$, are connected with one end of each writing bit line BLwβ or BLwβ. The precharge MOSFETs Q58 and Q58' are controlled in their switching by using the above mentioned reading clock signal CER and, when they are switched on, in response to a precharging period that is indicated by the low level of the reading clock CER, the reading bit lines BLrβ and $\overline{BLrβ}$ are precharged to the power supply voltage $V_{DD}$. On the other hand, the precharge MOSFETs Q59 and Q59' are controlled in their switching by using the above mentioned writing clock signal CEW and, when they are switched on, in response to a precharging period that is indicated by the low level of the writing check CEW, the writing bit lines BLwβ and $\overline{BLwβ}$ are precharged to the power supply voltage $V_{DD}$.

When the writing bit lines BLwβ, BLwβ and reading bit lines BLrβ, $\overline{BLrβ}$ are precharged to the power supply voltage $V_{DD}$, both common writing data lines CDw, $\overline{CDw}$ and common reading data lines Cdr, $\overline{CDr}$ are precharged to the power supply voltage $V_{DD}$, the details of which will be described later. When reading memory cell data is in this condition, common reading data lines CDr, $\overline{CDr}$ and a reading bit line that is conductive with a selected memory cell, start to change minutely their levels from the power supply voltage $V_{DD}$, by the discharging operation of one of the selective MOSFETs Q52, Q52' which is switched on according to the information stored in the memory cell. In the writing operation, a writing bit line that is conductive with the selected memory cell and one of the writing common data lines CDw and $\overline{CDw}$ are discharged from the power supply voltage $V_{DD}$ toward the ground potential Vss, till the level that can invert the information is stored in the memory cell if a data driver for writing 3 is operating.

The above mentioned writing bit lines BLw1, $\overline{BLw1}$~BLw2(n−i), $\overline{BLW2(n−i)}$ are connected commonly with the writing, common data lines CDw, $\overline{CDw}$ through n-channel selective MOSFETs Q70 and Q70 that construct a Y selector for writing 2. The reading bit lines BLr1, BLr1~BLr2(n−i), BLr2(n−i) are connected commonly with the reading, common data lines CDr, $\overline{CDr}$ through p-channel selective MOSFETs Q71 and Q71' that construct a Y selector for reading 4.

Here, both of the writing bit lines BLwβ, $\overline{BLwβ}$ and the reading bit lines BLrβ, $\overline{BLrβ}$ are precharged to a power supply voltage $V_{DD}$ of a relatively high level. So, the writing, common data lines CDw, $\overline{CDw}$ and the reading, common data lines CDr, $\overline{CDr}$ are precharged to the power supply voltage $V_{DD}$, too. When the memory cell data are transmitted from the reading bit lines BLrβ, $\overline{BLrβ}$ to the reading, common data lines CDr, $\overline{CDr}$ during the above mentioned operating condition, the p-channel selective MOSFETs Q71 and Q71' that are switched on, have a large, mutual conductance. This large, mutual conductance functions to increase transmission performance of the memory cell data therethrough, wherein a change in the vicinity of the power supply voltage $V_{DD}$ is realized. During the writing operation period, one of the writing, common data lines CDw, $\overline{CDw}$ is discharged from the precharging level of the power supply voltage $V_{DD}$ to the ground potential of the circuit Vss and it is necessary that such a discharging level is transmitted to the memory cell in order to increase the reliability of writing operation. At that time, the n-channel selective MOSFETs Q70 and Q70' that are switched on, have a large, mutual conductance. As a result, the large, mutual conductance operates to increase the performance of transmitting a level change of the writing, common data lines CDw, $\overline{CDw}$ discharged from the power supply voltage $V_{DD}$ to a writing bit line.

A selective control of the writing bit lines $BLw\beta$ and $\overline{BLw\beta}$ is done by a Y address buffer 24 and a Y address decoder for writing 25 through the selective MOSFETs Q70 and Q70' that are included in a selector for writing 2.

The above mentioned writing, Y-address buffer 24 transforms the writing address signals Awj to Awn into the complementary address signals awj, $\overline{awj}$~awn, $\overline{awn}$ so as to output them. The writing Y-address decoder 25 decodes the complementary address signals awj, $\overline{awj}$~awn, $\overline{awn}$ that are supplied from the above mentioned writing, Y-address buffer 24 and generates the writing, bit line selective signals BLSw1 to BLSw2(n−i), which control the selective MOSFETs Q70 and Q70' corresponding to a certain pair of bit lines among the writing bit lines BLw1, $\overline{BLw1}$~BLw2(n−1), $\overline{BLw2(n-1)}$ to be switched on. For example, as shown in FIG. 12, an output of a NAND gate 26 is inverted by an inverter circuit 27 and supplied to the gate electrodes of the selective MOSFETs Q70 and Q70'. Such a logic circuit construction is used for each pair of writing bit lines. In such an address-decoding logic construction, whichever combinations of the levels of the writing address signals Awj to Awn may be present, a corresponding one of the writing bit line selective signals is made high level, and therefore an associated pair of selective MOSFETs Q70 and Q71 are switched on.

A selective control of the reading bit lines $BLr\beta$ and $\overline{BLr\beta}$ by the selective MOSFETs Q71 and Q71' that are included in the selector for reading 4, is performed by a Y address buffer for reading 28 and a Y address decoder for reading 29.

The Y address buffer for reading 28 will transform the reading address signals Arj to Arn to complementary address signals arj, $\overline{arj}$~arn, $\overline{arn}$ so as to output them. The Y address decoder for reading 29 decodes the complementary address signals arj, $\overline{arj}$~arn, $\overline{arn}$ that are supplied from the reading address buffer 31, and generates reading bit line selective signals BLSr1 to BLSr2(n−i) so as to control the selective MOSFETs Q71 and Q71' corresponding to a certain pair of lines among the reading bit lines BLr1, $\overline{BLr1}$~BLr2(n−i), $\overline{BLr2(n-i)}$ to be switched on. For example, as shown in FIG. 12, a logic circuit is formed for each pair of heading bit lines in such a way that an output signal of a NAND gate 30 is supplied to the gate electrodes of the selective MOSFETs Q71 and Q71'.

In this embodiment, each NAND gate 30 that is included in the reading Y-address decoder 29 is supplied with a detecting signal AC from the above mentioned address accordance detector 8. This detecting signal AC has a high level when the accordance occurs, but a low level when no accordance occurs. Therefore, when writing addresses Aw1 to Awn coincide with reading addresses Ar1 to Arn, an output signal of the NANd gate 30 is forced to a high level; so both of the selective MOSFETs Q71 and Q71' that are included in the Y selector for reading 4, are switched off, and the reading, common data lines CDr and $\overline{CDr}$ are cut off from all of the reading bit lines BLr1, $\overline{BLr1}$~BLr2(n−i), $\overline{BLr2(n-i)}$. In this way, when a reading address coincides with a writing address, and when the writing, common data lines CDw and $\overline{CDw}$ are given with writing data that will be transformed to the reading, common data lines CDr and $\overline{CDr}$ through a short circuit 9, all of the reading, bit lines become non-conductive with the common data lines CDr and $\overline{CDr}$, and therefore this non-conductive control condition functions in such a way that the compatibility is avoided between the data that is read from the selected memory cell, and the writing data given to the reading system.

On the other hand, when the writing addresses Aw1 to Awn do not coincide with the reading addresses Ar1 to Arn, and whichever combination the levels of the reading, address signals Arj to Arn may be, a corresponding one of the reading bit line selective signals is made a low level, and a pair of associated selective MOSFETs Q71 and Q71' are switched on; therefore, when the reading bit lines BLr1, $\overline{BLr1}$~BLr2(n−i), $\overline{BLr2(n-i)}$ are precharged to the power supply voltage $V_{DD}$, the reading, common data lines CDr, $\overline{CDr}$ are, in response to that, precharged to the power supply voltage $V_{DD}$, too.

In FIG. 12, a short circuit 9 that makes the writing, common data lines CDw, $\overline{CDw}$ and the reading, common data lines CDr, $\overline{CDr}$ conductive selectively, is constructed with a pair of p-channel transmitting MOSFETs Q72 and Q72'. These transmitting MOSFETs Q72 and Q72'. These transmitting MOSFETs Q72 and Q72' are controlled and switched when the above mentioned detecting signal AC, i.e. a logic high level, is supplied to their gates.

When the writing data are transmitted to the reading, common data lines CDr and $\overline{CDr}$ through the transmitting MOSFETs Q72 and Q72', both of the writing, common data lines CDw, $\overline{CDw}$ and the reading, common data lines CDr, $\overline{CDr}$ are set to the writing voltage. At this time, the p-channel transmitting MOSFETs Q72 and Q72' that are already switched on, have a large, mutual conductance; as a result, the large, mutual conductance functions so as to enhance the transmitting performance of the complementary levels of common data lines CDw, $\overline{CDw}$ that are going to change from the vicinity of the power supply voltage $V_{DD}$.

Figure 16:
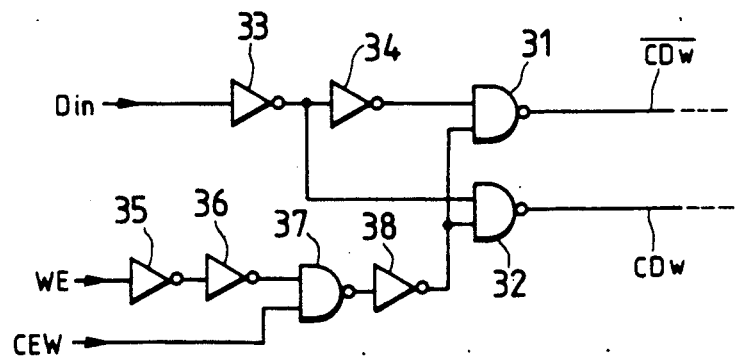
FIG. 16 illustrates an example of a writing data driver.

FIG. 16 shows an example of a data driver for writing 3.

This data driver for writing 3 has two 2-input NAND gates 31 and 32 as an output stage for driving; one NAND gate 31 is supplied with writing data Din through serially connected two-stage CMOS inverters 33 and 34, and the other NAND gate 32 is supplied with an inverted level of the writing data Din through the above mentioned CMOS inverter 33. The output of each of the NAND gates 31 and 32 is controlled by the above mentioned writing clock signal CEW and a writing enable signal that indicates a writing operation when it is a high level. The control logic for this purpose has a 2-input NAND gate 37, to which a writing clock signal CEW is supplied as well as a writing enable signal WE is supplied through serially connected two-stage CMOS inverters 35 and 36, and the output of the NAND gate 37 is inverted by the CMOS inverter 38 so as to supply a logic high level to the other input of each of the above mentioned pair of NAND gates 31 and 32 when both inputs of NAND gate 37 are at a high level.

Such a data driver for writing 3 drives the writing, common data lines CDw and $\overline{CDw}$ to complementary levels according to the writing data Din when the writing enable signal WE and the writing clock signal are both in a high level. Otherwise, both of the writing, common data lines CDw and $\overline{CDw}$ are forced to the power supply voltage Vdd that is equal to the precharging level.

Figure 17:
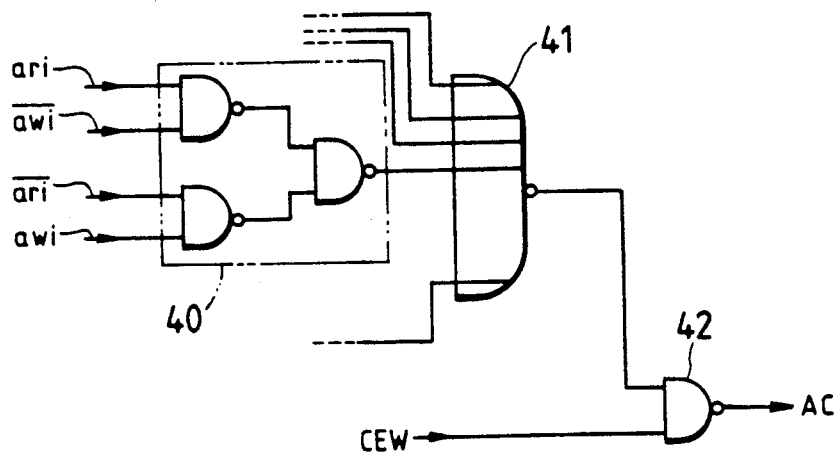
FIG. 17 illustrates an example of a circuit to detect the address coincidence.

FIG. 17 shows an example of the address accordance detector 8.

This address accordance detector 8 discriminates the accordance, i.e. for coincidence, of the complementary writing addresses aw1, $\overline{aw1}$ ~awn, $\overline{awn}$ and the complementary reading addresses ar1, $\overline{ar1}$ ~arn, $\overline{arn}$ for every corresponding bit by using an exclusive OR circuit 40, respectively, and therefore the accordance of each bit is decided by a NOR gate 41. When all of the writing addresses and the reading ones have the accordance, an output signal of the NOR gate is made a high level. At this time, in order to avoid the transmitting MOSFETs Q72 and Q72' from being switched on falsely, except for that writing operation and reading operation performed for the same memory cells with approximately the same timing, an output signal of the NOR gate 41 is inputted to a NAND gate 42 which is also inputted with the writing clock signal CEW, and therefore the detecting signal AC is formed through such a NAND logic.

A sense amplifier 5 can be of the same construction as the one shown in FIG. 1 or FIG. 9.

Now, in the 2-port RAM of this embodiment, an example of the reading and writing operation will be explained referring to FIG. 18 for the case wherein a writing address does not coincide with a reading address.

Figure 18:
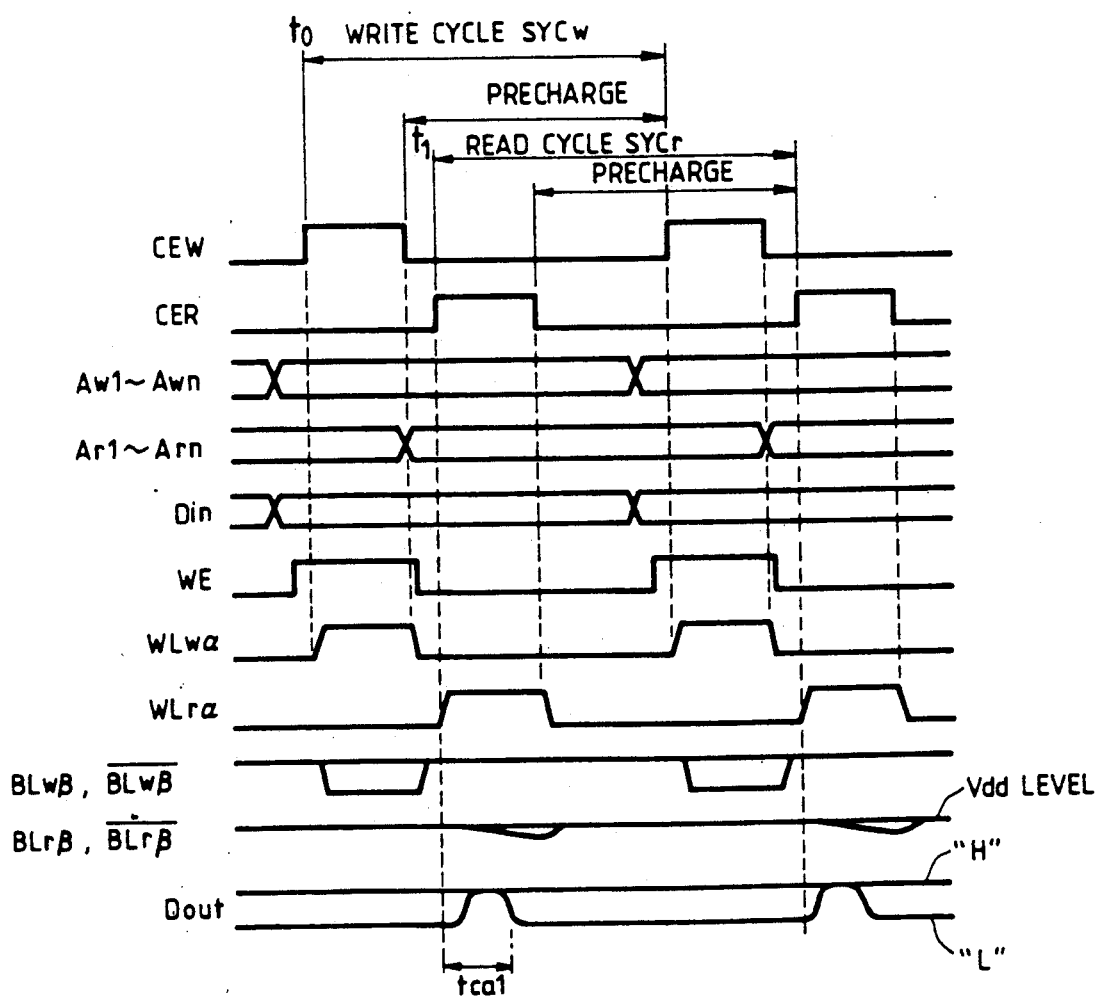
FIG. 18 illustrates timing charts to explain an example of reading and writing operation when the writing address is not conforming to the reading one.

In FIG. 18, a reading clock signal CER and a writing clock signal CEW have the phase difference shown. In this case, SYCr indicates a ready cycle, SYCw indicates a write cycle, and a period during which a clock signal CER or CEW has a low level is the precharging period for each cycle. The reading clock signal CER, in its function, corresponds to the signal $\phi sa$ shown in FIG. 1.

When the writing clock signal CEW becomes a high level at a time $t_0$, an X address buffer for writing 21, an X address decoder for writing 22, and a word driver for writing 23 are operated according to the writing address signals Aw1 to Awi at that time, and therefore a certain writing word line WLwα is driven to the selected level corresponding to the related, writing address signals Aw1 to Awi. In the same manner, a Y address buffer for writing 24, a Y address decoder for writing 25, and a Y selector for writing 2 are operated according to the writing address signals Awj to Awn, wherein a certain pair of writing bit lines BLwβ and $\overline{BLw\beta}$ becomes controllably connected with the common data lines CDw and $\overline{CDw}$ according to the related, writing address signals Awj to Awn. At that time, a data driver for writing 3 is made ready for operation by a high level of both the writing enable signal WE and the writing clock signal CEW, and drives the writing common data lines CDw and $\overline{CDw}$ to the complementary levels accc 'ing to the writing data Din. When the driving signal i: 'en to the above mentioned pair of bit lines BLwβ and $\overline{BLw\beta}$, the predetermined data are written into the memory cell selected in response to the writing address signals Aw1 to Awn.

When the reading clock signal CER is made high level at a time $t_1$ shown in FIG. 18, an X address buffer for reading 13, an X address decoder for reading 14, and a word driver for reading 15 are operated according to the reading address signals Ar1 to Ari at that time, and therefore a certain reading word lines WLrα is driven to the selected level corresponding to the related, reading address signals Ar1 to Ari. In the same manner, a Y address buffer for reading 28, a Y address decoder for reading 29, and a Y selector for reading 4 are operated according to the reading address signals Arj to Arn, wherein a certain pair of reading bit lines BLrβ and $\overline{BLr\beta}$ become controllably connected with the common data lines CDr and $\overline{CDr}$ in accordance with the related, reading address signals Arj to Arn. In this way, when the data of a selected memory cell is transmitted to the reading, common data lines CDr and $\overline{CDr}$ in response to the reading address signals AR1 to Arn, a sense amplifier 5 detects a change of the levels generated on the common data lines CDr and $\overline{CDr}$ so as to amplify it. An output amplified by the sense amplifier 5 is received by an output latch circuit 6 which then provides it to an output buffer 7, and is supplied from output buffer 7 externally as reading data Dout.

In the reading operation, the sense amplifier 5 is influenced by the function of the level shift circuit L5, wherein it immediately detects a minute level change from an initial level of the power supply voltage $V_{dd}$ for the reading bit lines, and for the reading, common data lines CDr and $\overline{CDr}$ so as to settle its output operation during a selective period of the reading word lines which is made lower. In response to this, the amplitudes of the reading bit lines and reading, common data lines that change when the data is reading, are restricted to a change only to the vicinity of the power supply voltage $V_{dd}$ from an initial level corresponding to the power supply $V_{dd}$.

The access time is considered as $tca_1$ shown in FIG. 18, from the assertion of the reading clock signal CER at a time $t_1$ until the setting up of the reading data Dout.

In the operation shown by the time charts of FIG. 18, a writing address does not coincide with a reading address when the writing clock signal CEW is at a high level, and the period when the reading clock CER has a high level, does not overlap with the period when the writing clock CEW has a high level. Therefore the detecting signal AC always has a high level so that the transmitting MOSFETs Q72 and Q72' included in the short circuit 9 maintain their conditions switched off.

Figure 19:
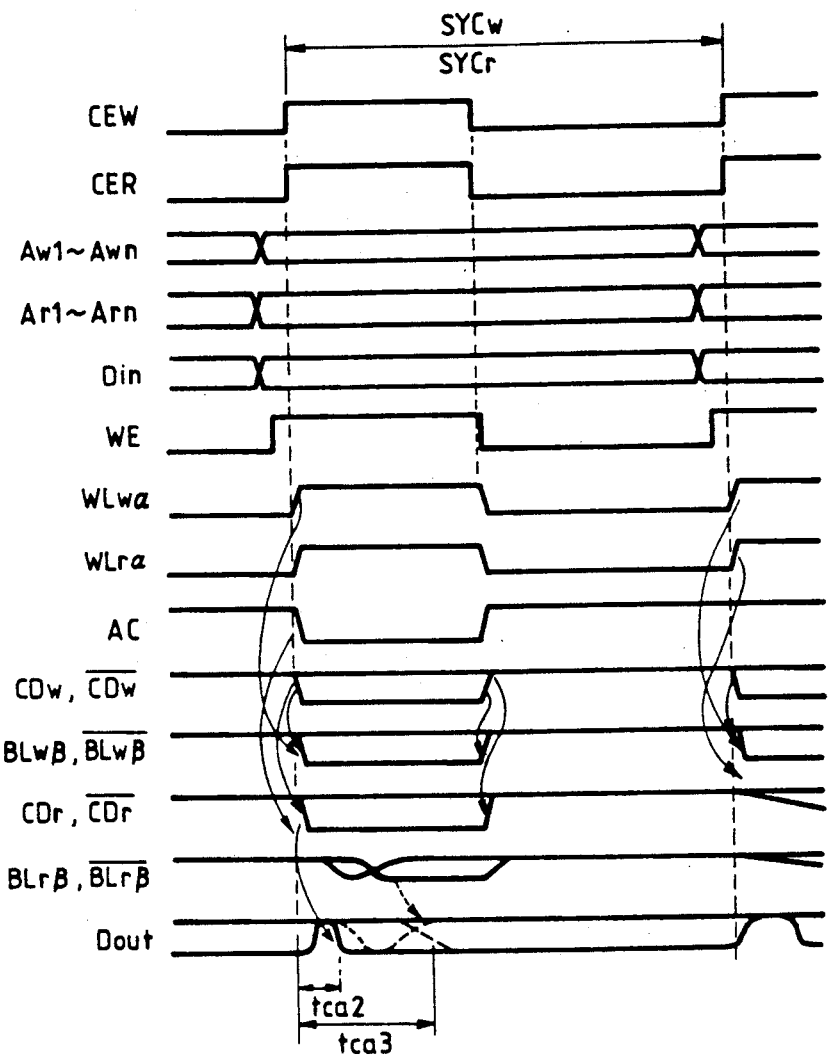
FIG. 19 illustrates timing charts, in which the reading and writing operation is done at the same time.

Now in the 2-port RAM of this embodiment, an example of operation, in which reading and writing processes are done with the same timing for the same memory cell, is explained referring to FIG. 19.

In FIG. 19, the phase of a reading clock signal CER coincides with that of a writing clock signal CER and therefore a read cycle SYCr and a write cycle SYCw are wholly overlapped.

Even when the high level periods of the writing clock CEW and the reading clock CER are overlapped, the fundamental operation for reading or writing will be done independently, similarly as in the previous description. This is especially when the accordance of writing addresses Aw1 to Awn and reading addresses Ar1 to Arn is discriminated by the address accordance detector 8, which monitors the accordance of these addresses at the time of a high level of the writing clock CEW, wherein a detecting signal AC is made low level, thereby switching on the transmitting MOSFETs Q72 and Q72' that are included in a short circuit 9. In this way, the transmitting MOSFETs Q72 and Q72', after being switched on, transmit, directly, a driving signal of the writing data driver 3 from the writing common data lines CDw, $\overline{\text{CDw}}$ to the reading common data lines CDr, $\overline{\text{CDr}}$ according to the writing data Din.

Writing data transmitted in such a way is provided at the sense amplifier 5, wherein it is then supplied to the outside according to the usual timing to read data. Therefore, the data being transmitted to the outside actually satisfies the condition that writing is given priority, and the operation to read out data is done in parallel with writing operation; therefore, it is not necessary to wait for the completion of the reading operation until the data once written are read out again, as it is necessary according to the conventional manner for satisfying the condition of priority. According to the present invention reading operation, reading information of a memory cell is not used, so the access time $tca_2$ is a little bit shorter than the one explained in FIG. 18 ($tca_1$).

Changes of reading bit lines BLr$\beta$ and $\overline{\text{BLr}\beta}$ indicated in FIG. 19, shows a condition that the information stored in the selected memory cell is inverted by writing data Din at that time. That is, the levels of the reading bit lines BLr$\beta$ and $\overline{\text{BLr}\beta}$ change at first according to the information stored in the memory cell; but, after this, the data of the related memory cell are inverted by writing data Din, and therefore the level change of the reading bit lines BLr$\beta$ and $\overline{\text{BLr}\beta}$ is inverted. In the conventional manner, when level changes of the reading bit lines BLr$\beta$ and $\overline{\text{BLr}\beta}$ are read out through the reading operation, via common data lines CDr and $\overline{\text{CDr}}$, a setting up of or attainment of a reading data Dout is delayed as shown in the broken lines, and the acess time $tca_3$ becomes very large. In this case, a level change of the reading bit lines BLr$\beta$ and $\overline{\text{BLr}\beta}$ is more exaggerated than the actual condition.

Therefore, even if the 2-port RAM of this embodiment is operated with high-speed using the access time explained in FIG. 18, it is not restricted to the condition that the reading and writing should not have an access to the same memory at the same time, and therefore the 2-port memory RAM of this embodiment can have an access with a high speed in any access condition.

Figure 20:
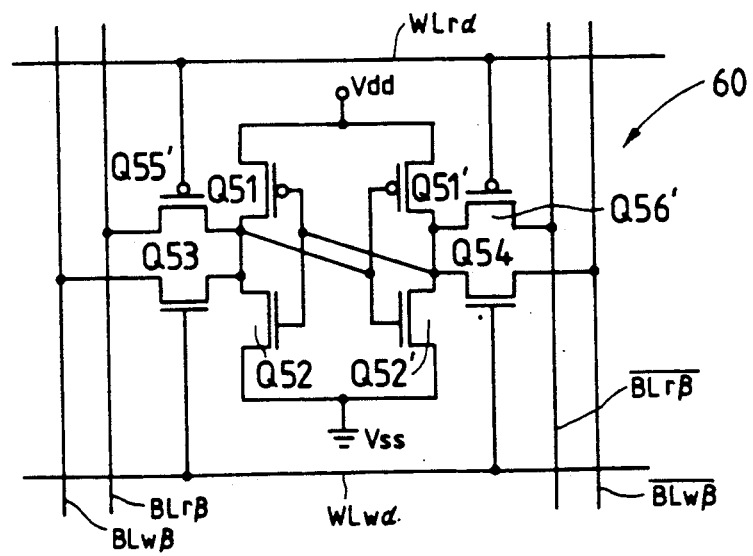
FIG. 20 and FIG. 21 are circuit diagrams of an example of the memory cell construction, in which the conductive types of MOS transistors are different from each other for each case of constructing the writing or reading transfer gate.
Figure 21:
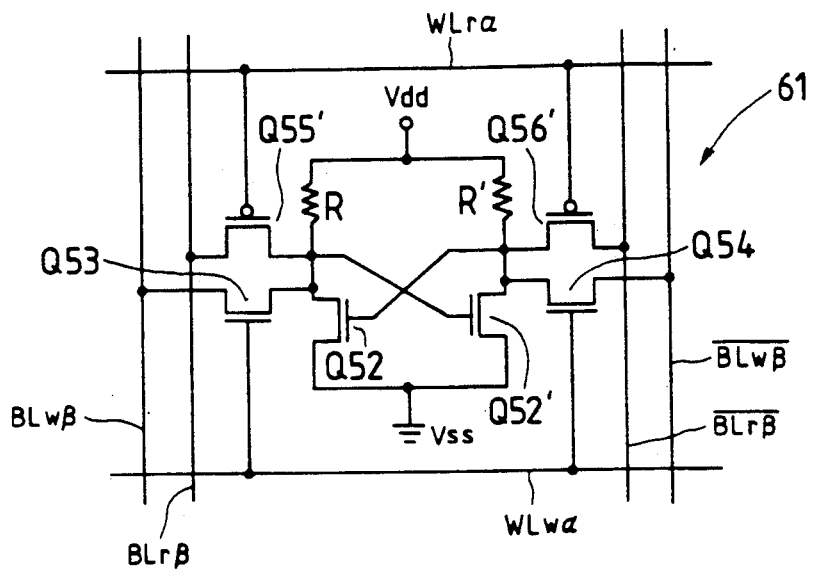

In the 2-port RAM which comprises a reading system and writing system able to do both a reading operation and a writing operation asynchronously and independently for a static memory cell, and in this case, the static memory cell is connected with a writing bit line and a reading bit line where a power supply voltage level that is relatively high is a precharging level, the memory cells constructed as shown in FIG. 20 or FIG. 21 can be used.

A memory cell 60 shown in FIG. 20 is different from the above mentioned memory cell 10 in that p-channel MOSFETs Q55' and Q56' are used for a reading transfer gate.

A memory cell 61 shown in FIG. 21 is different from the memory cell 60 of FIG. 20 in that load resistances R and R' are used.

When a 2-port RAM is construced by using memory cells 60 and 61, the consruction of the embodiment 1 can be used as it is except for the fact that the selective level is instead set to a low level.

In this embodiment, writing bit lines BLw$\beta$, $\overline{\text{BLw}\beta}$ and reading bit lines BLr$\beta$, $\overline{\text{BLr}\beta}$ are all precharged to a power supply voltage of a higher level. When memory cell data are transferred to the reading bit lines BLr$\beta$ and $\overline{\text{BLr}\beta}$ in this condition, p-channel MOSFETs Q55' and Q56' that construct a reading transfer gate to be switched on have a large mutual conductance; as a result, the large mutual conductance functions to enhance the transmission performance of memory cell data that will change the reading bit lines to a level difference in the vicinity of the power supply voltage $V_{DD}$. In the writing operation, n-channel MOSFETs Q53 and Q54 are used for constructing a writing transfer gate, which is conductive with writing bit lines BLw$\beta$ and $\overline{\text{BLw}\beta}$ which are to be discharged from a precharging level at such time as when their mutual conductance increases, wherein the large mutual conductance functions to enhance the transmission performance of a level change of the writing bit lines to a static latch circuit, being discharged from the power supply voltage $V_{dd}$.

In such a precharging method that a writing bit line and a reading bit line are precharged to a power supply voltage having a higher level, a writing transfer gate is constructed with n-channel MOSFETs, and a reading transfer gate is constructed with p-channel MOSFETs; therefore, a minute potential change can be given, as it is in response to memory cell data, to a reading bit line that is already precharged to the power supply voltage $V_{DD}$, wherein a reading speed of data is increased without an adverse effect of the writing performance.

Especially in a CMOS static latch circuit shown in FIG. 20, which is included in the memory cell, reading and writing transfer gates are also constructed with CMOS circuits, and transistors forming a transfer gate can be made by extending a diffusion layer that is used for constructing a static latch circuit, and therefore the layout of transistors can be implemented easily during construction of a memory cell.

By combining the memory cell constructions shown in FIG. 20 and FIG. 21 with a sense amplifier 5 explained in the embodiment 1, still more with a Y selector for reading 4 that is constructed with p-channel MOSFETs, and a Y selector for writing 2 that is constructed with n-channel MOSFETs, data reading operation of a 2-port RAM can be done with the higher speed.

Although this invention has been described specifically in reference to the illustrated embodiments, it will be understood that this invention is not limited to the embodiments illustrated and that various modifications may occur within the scope of this invention.

Figure 22:
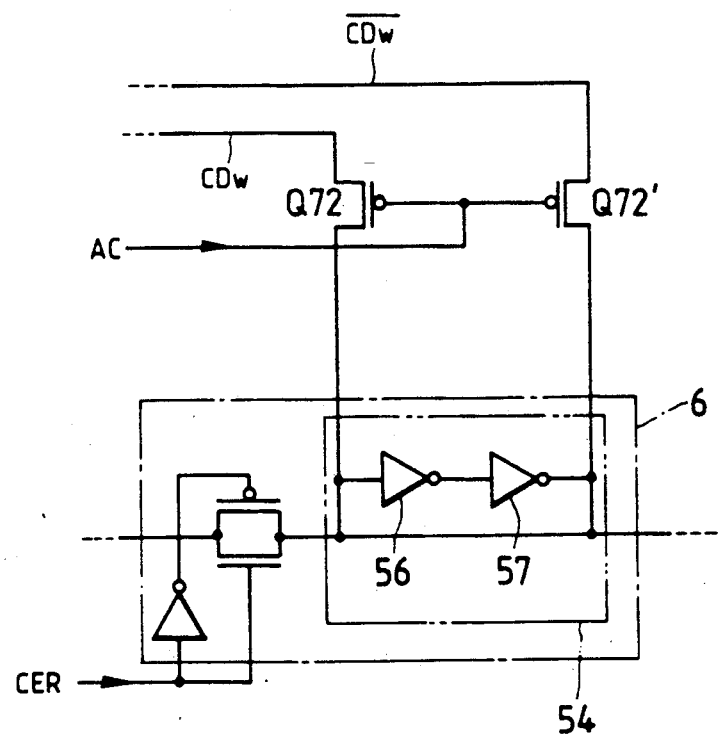
FIG. 22 illustrates another embodiment of the transmitting means in a circuit diagram.

As shown in FIG. 22, writing data may be supplied to an output latch circuit 6.

Figure 23:
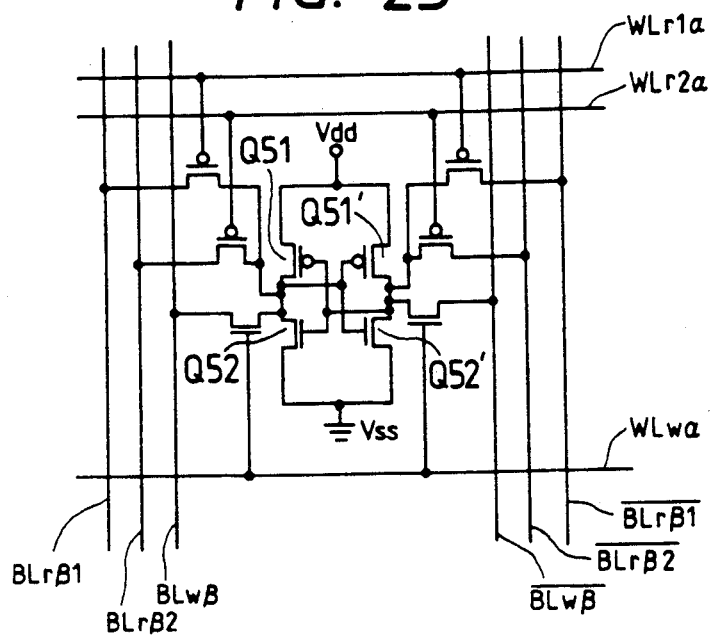
FIG. 23 is a circuit diagram of an example of a memory cell that can be used for a 3-port RAM.

This invention is not limited to a 2-port RAM; if a memory cell shown in FIG. 23 is used, this invention can be applied to a 3-port RAM, and, furthermore to a multi-port RAM that has more than three ports.

Figure 24:
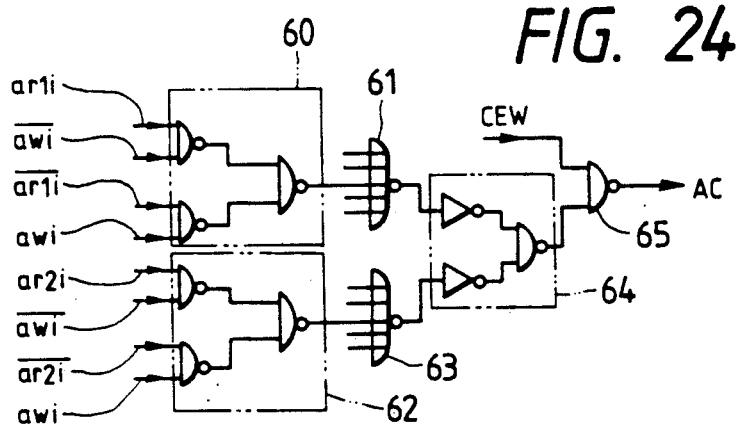
FIG. 24 shows an example of the address-coincidence detecting circuit constructed with the memory cells shown in FIG. 23 in a 3-port RAM.

When a port RAM is constructed by using memory cells shown in FIG. 23, such a circuit construction as shown in FIG. 24 can be used as an address accordance detector. An address accordance detector shown in FIG. 24 is to discriminate, relating to the first reading port, the accordance of a reading address and a writing address for each corresponding bit by using an exclusive OR circuit 60, and the accordance of each bit is decided with a NOR gate 61. In the same manner, the accordance of a reading address and a writing address relating to the second port, is discriminated for each corresponding bit by using an exclusive OR circuit 62, and the accordance of each bit is decided with a NOR gate 63. The results decided by both the NOR gates are processed by an OR logic 64, and then processed with a writing clock signal CEW by using a NAND logic 65 so as to form a detecting signal AC.

Figure 25:
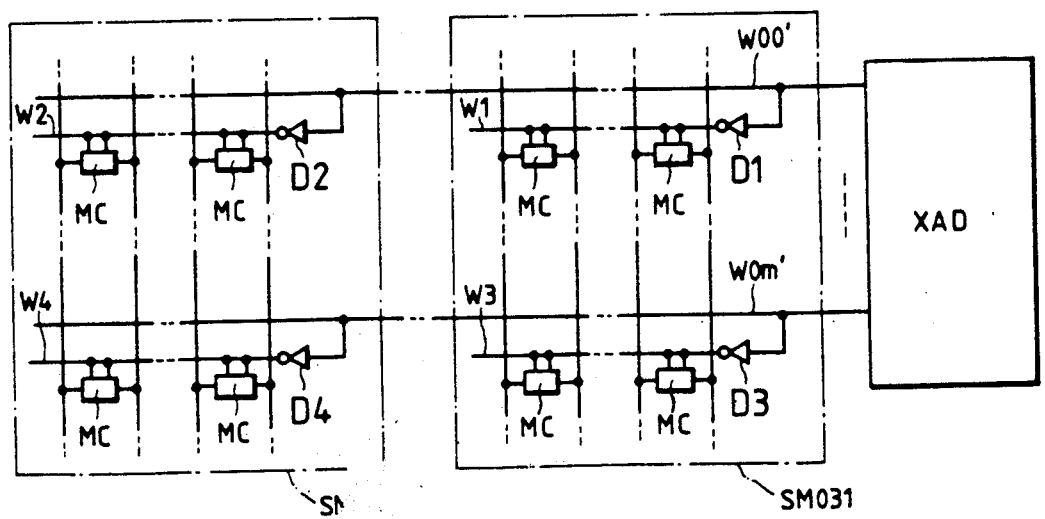
FIG. 25 shows in circuit diagram another embodiment of the word-line construction shown in FIG. 5 and FIG. 11.

The present invention is not limited to the above mentioned embodiments from FIG. 1 to FIG. 24. For example, in the static RAM shown in FIG. 5, word lines from W00 to W0m can be formed as shown in FIG. 25.

These subordinate word lines W1 to W4 are connected with the corresponding, inverted, main word lines W00' to W0m' through the corresponding word line driving circuits D1 to D4, that is, CMOS inverter circuits. The subordinate memory arrays SM00 to SM031 and subordinate column switches SS00 to SS031 (refer to FIG. 5) are constructed as a unit, and their numbers are selectively increased or decreased according to the bit construction of the clock static RAM. In this case, address decoders can be integrated as a block corresponding to each subordinate memory array. Therefore, the clocked-static RAM of this embodiment decreases the loads relating to each inverted, main word lines W00' to W0m', and its operation becomes high-speed because each driving circuit D1, D2, D3 or D4 is used for each subordinate word line W1, W2, W3 or W4, and therefore a disconnection of main word lines owing to the electromigration can be prevented. The flexibility of bit construction and therefore system construction is improved because the subordinate memory arrays, column switches and address decoders are formed as a unit.

Figure 26:
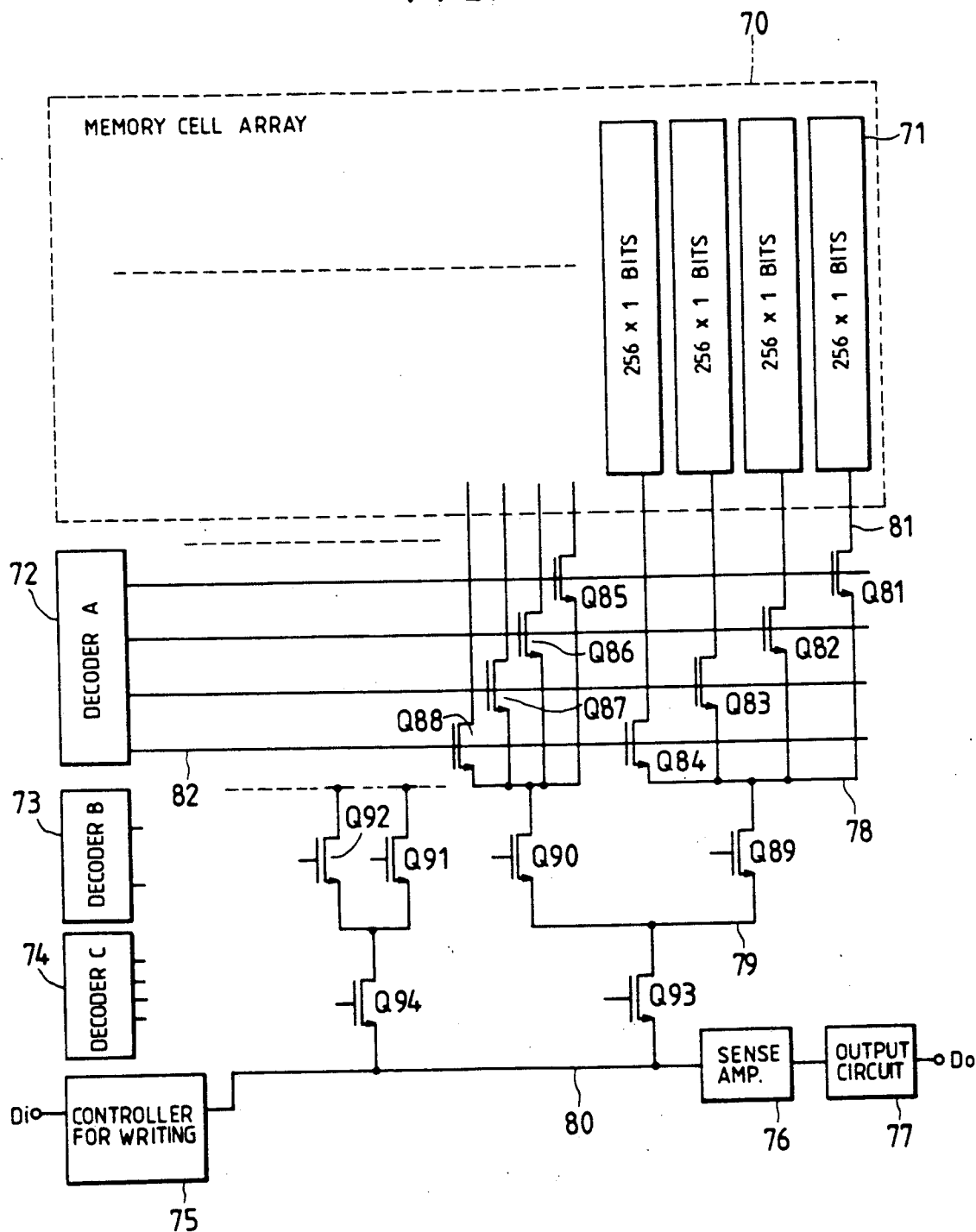
FIG. 26 shows in circuit diagram another embodiment of the common data line construction shown in FIG. 5 and FIG. 11.

FIG. 26 shows an example of the construction of the common data lines. In the figure are shown a memory cell array 70, units of memory cell lines 71, decoders 72 to 74, a controller for writing 75, a sense amplifier 76, an output circuit 77, a common data line of the first class 78, a common data line of the second class 79, a common data line of the third class 80, data lines of single end type 81, and decoder output lines 82 to control Y switches. These are shown as Y-switch NMOS transistors Q80 to Q88 for the first class common data line 78, Y-switch NMOS transistors Q89 to Q92 for the second class common data line 79, and Y-switch NMOS transistors Q93 and Q94 for the third class common data line. Di is a data input signal, and Do is an output signal. A decoder 72 is the decoder for the first class A, a decoder 72 is the decoder for the second class B, and a decoder 74 is the decoder for the third class C. If the capacity of memory is 16K bits in FIG. 26, the number of the above mentioned memory cells will be 54. Sixteen common data lines of the first class 78 are formed when they are divided by using four Y-switches. Eight common data lines of the second class 79 are formed when they are divided by using two Y-switches. The common data lines of the third class 80 are connected with eight Y-switches. In order to select one from 54 memory cell arrays in the above mentioned construction, seven switches of the common data lines of the third class 80, a switch of the common data lines of the second class 79, and three switches of the common data lines of the first class 78, that is, eleven switches in all are open, and therefore a desired data line is connected with the common data lines of the third class 80. In this case, if only the common data lines of the first class are used, 53 switches should be made open so that the die tric capacitance of the common data lines increas nd therefore reading and writing processes are delayed. If common data lines are classified so as to construct a memory of large capacity, an increase of the dielectric capacitance of common data lines can be oppressed significantly.

Application of the inventive sense amplifier is not limited to memory.

Figure 27:
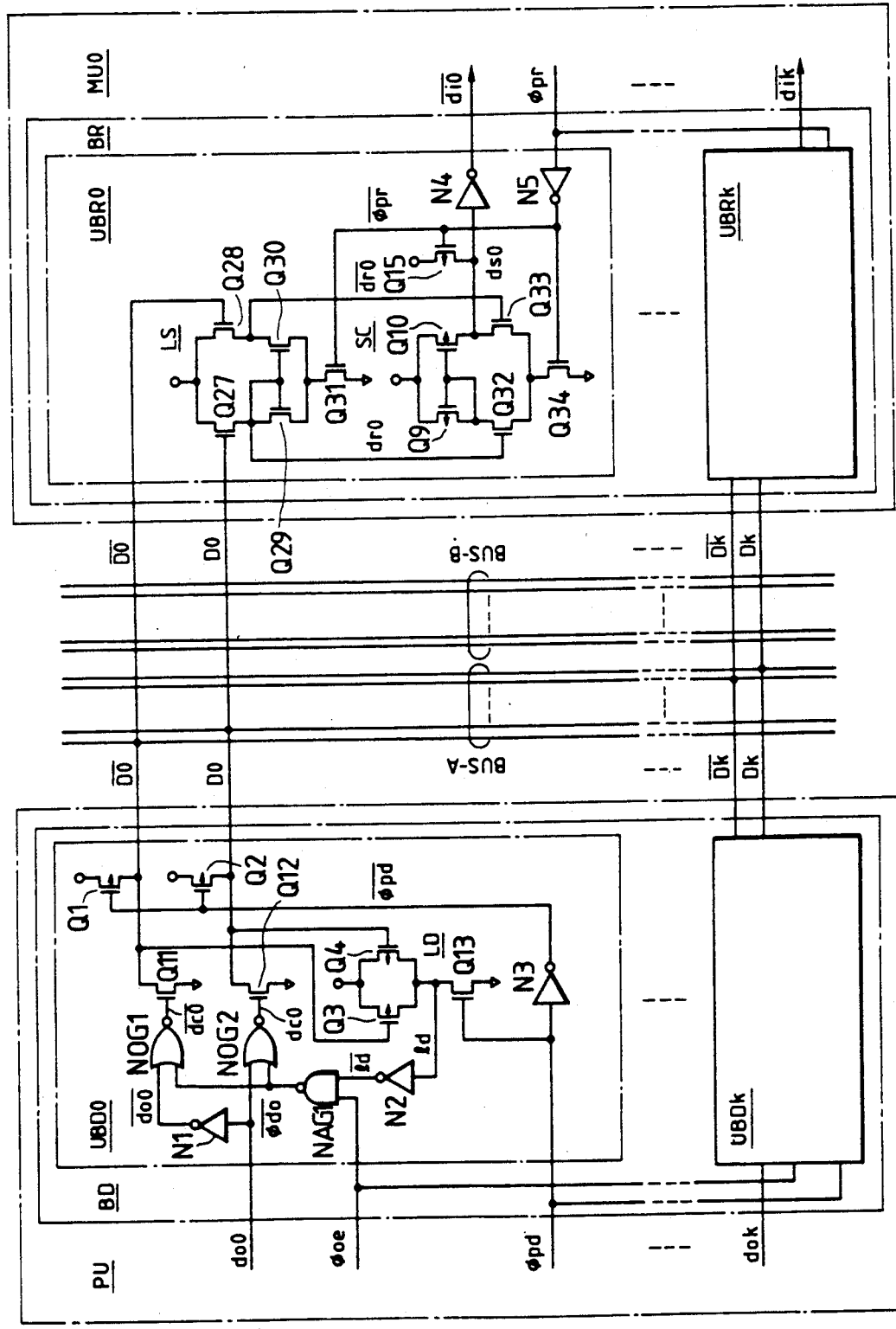
FIG. 27 shows in circuit diagram an embodiment of a bus receiver and a bus driver using signal transmitting system according to the invention.
Figure 28:
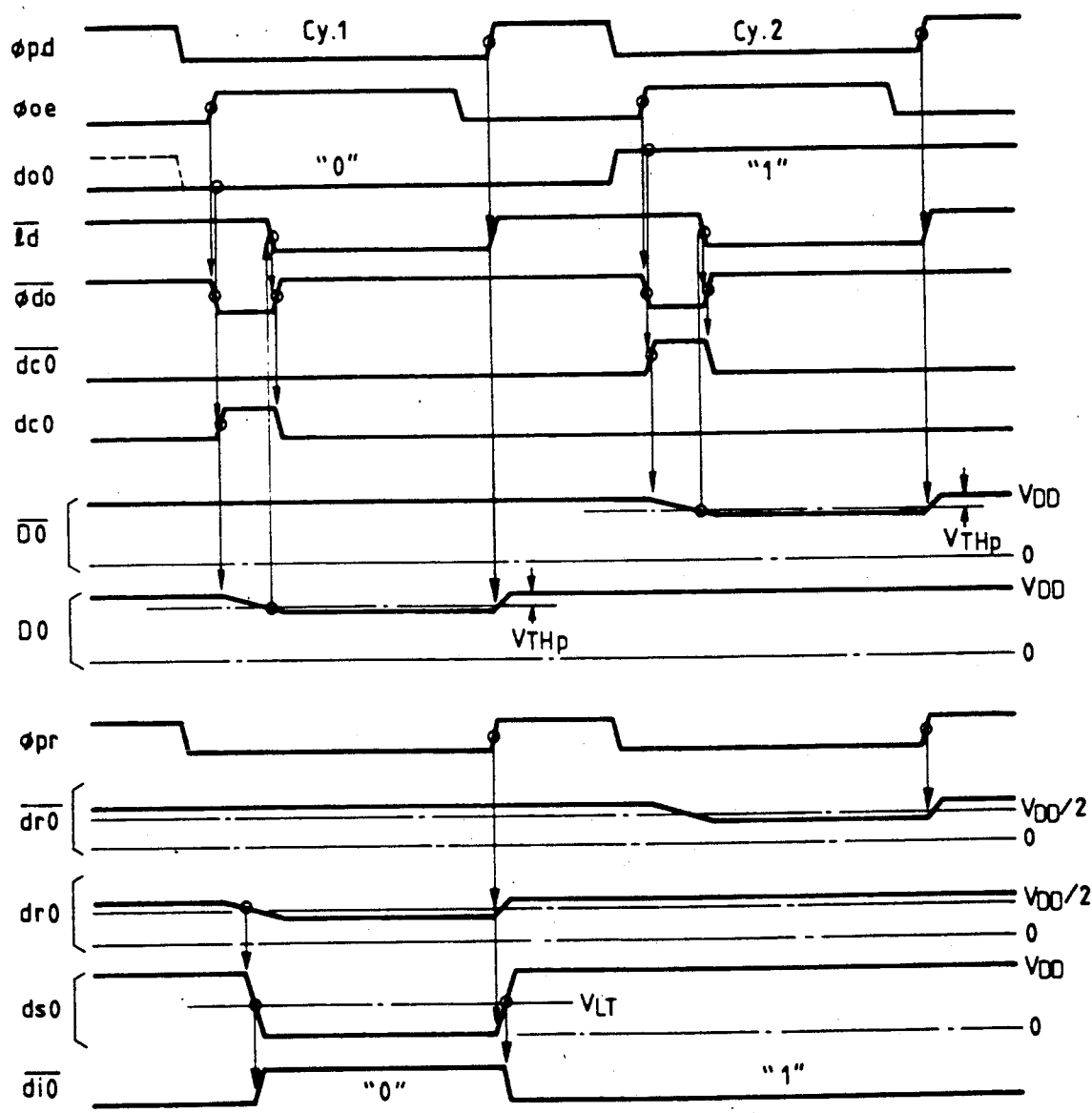
FIG. 28 illustrates signal waveforms of the embodiments of a bus driver and a bus receiver shown in FIG. 27.
Figure 29:
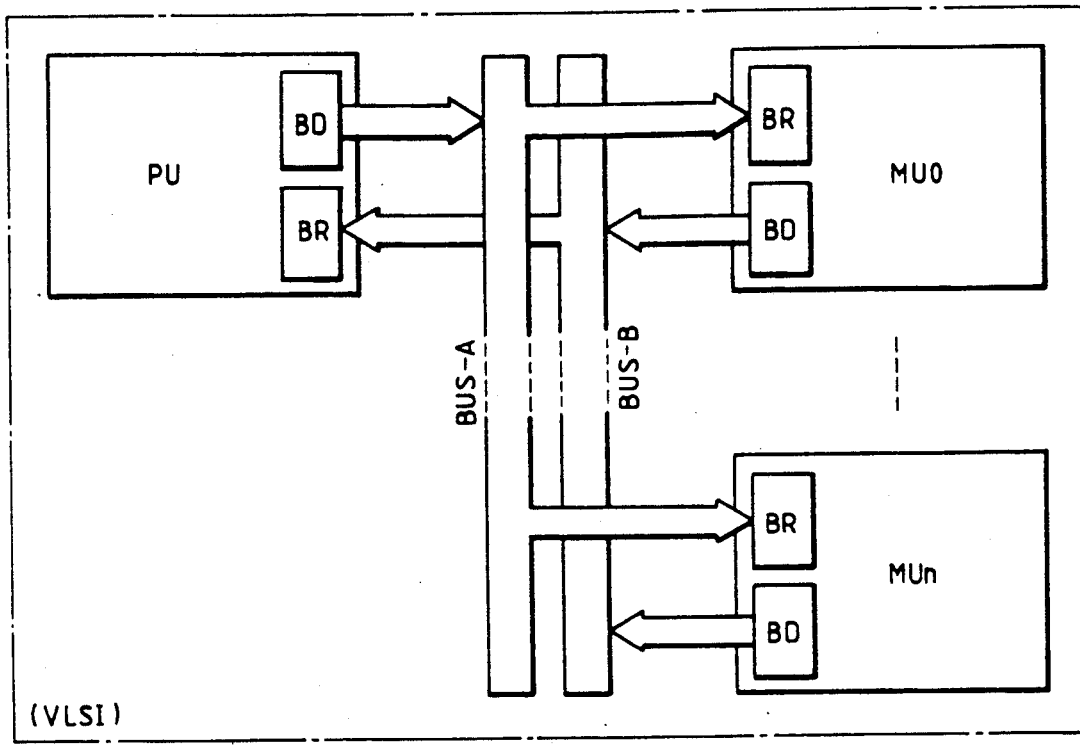
FIG. 29 is a block diagram of an embodiment of a digital processing means using signal transmission system according to the invention.

FIG. 29 shows a block diagram of an embodiment of a digital processing unit that uses a signal transmission system applied to the inventive sense amplifier. In FIG. 27 are shown circuit diagrams of embodiments of a bus driver and a bus receiver that are used for a digital processing device shown in FIG. 29; in FIG. 28 are shown signal waveforms of the embodiments of a bus driver and a bus receiver shown in FIG. 27. With reference to these figures, a brief description of the construction and operation of the digital processing system of this embodiment and the characteristics of the signal transmission system will be explained. Now, in FIG. 27, MOSFETs added with an arrow on the channel (back gate) are of P-channel type, and are distinguished from the N-channel MOSFETs without an arrow.

In FIG. 29, the digital processing system, although not specifically limited thereto comprises a processor unit PU and (n+1) memory units MU0 to MUn. Such a processor unit and a memory units, although not specifically limited to a particular embodiment, are formed on one semiconductor substrate, for example, a single crystal silicon. As the result, the digital processing system is constructed as one chip of a large scale integrated circuit (VLSI).

Moreover, the digital processing system has two pairs of internal busses BUS-A and BUS-B. Each of these internal busses is, as shown in FIG. 27, constructed with two or more pairs of complementary signal lines, an output signal of the processor unit PU is transmitted to the memory units MU0 to MUn, and output signals of the memory units MU0 to MUn are transmitted to the processor unit PU, respectively. In this embodiment, amplitudes of a signal transmitted through internal busses BUS-A and BUS-B are limited to be a tenth, or a fifth or sixth of the absolute value of the power supply voltage of a circuit. As a result, inductive and capacitive power consumption of each internal bus is greatly decreased and therefore the lower power consumption is promoted in digital processing system. The above mentioned internal busses BUS-A and BUS-B may instead be an integrated one as two directional busses.

The processor unit PU and the memory units MU0 to MUn include, respectively, a bus driver BD and a bus receiver BR. Among them, a bus driver BD of the processor unit PU, as shown in FIG. 27, include (k+1) unit bus drivers UBD0 to UBDk corresponding to each of complementary signal lines D0, $\overline{D0} \sim$ Dk, $\overline{Dk}$ of the internal bus BUS-A. These unit bus drivers, although not specifically limited thereto, include, respectively, P-channel precharging MOSFETs Q1 and Q2 that are connected between the power supply voltage of the circuit and the inverted or non-inverted signal lines $\overline{D0}$ to $\overline{Dk}$ or D0 to Dk of each complementary pair of signal lines, and N-channel discharging MOSFETs Q11 and Q12 that are connected between the ground voltage of the circuit and the inverted or non-inverted signal lines $\overline{D0}$ to $\overline{Dk}$ or D0 to Dk of each pair of complementary signal lines. Here, the power supply voltage of the circuit should be positive, for example +5 V, although not limited thereto.

The gates of the precharging MOSFETs Q1 and Q2 are commonly connected and, although not limited thereto, are supplied with an output signal of an inverter circuit N3, that is, an inverted timing signal $\overline{\phi pd}$. An input terminal of the inverter circuit N3 is supplied with a timing signal $\phi pd$ from the timing generation circuit (not shown) of the processor unit PU. In this case, the timing signal $\phi pd$ is selected to a high level when the internal bus BUS-A is not in an active condition, in other words, when a signal is not transmitted to the internal bus BUS-A. It is needless to say that an inverted timing signal $\overline{\phi pd}$ has the complementary level relating to the above mentioned timing signal $\phi pd$.

The gates of the discharging MOSFETs Q11 and Q12 are, without any particular limitation, supplied with output signals of the corresponding NOR gate circuits NOG1 and NOG2, that is, inverted internal signals $\overline{dc0}$ etc. and non-inverted internal signals dc0 etc. One input terminal of the NOR gate NOG1 is supplied with an output signal of an inverter circuit N1 namely an inverted, internal output signal $\overline{Do0}$, etc. The input terminal of an inverter circuit N1 is supplied with an internal output signal Do0, etc. from the pre-stage circuit (not shown) of the processor unit PU. Here, the internal output signal Do0, etc. are selected to a high level when the corresponding transmitting signal is of logic 1. It is clear that the inverted, internal output signal $\overline{Do0}$, etc. are the complementary signals of the above mentioned internal output signal Do0, etc. Moreover, the internal output signal Do0, etc. are supplied to one input of the above NOR gate circuit NOG2. The other input of each of these NOR gates NOG1 and NOG2 is supplied with an output signal of a NAND gate NAG1, that is, an inverted timing signal $\overline{\phi d0}$, commonly.

One input terminal of the NAND gate NAG1, having no particular limitation, is supplied with a timing signal $\phi oe$ from a timing generation circuit (not shown in the figure). Here, the timing signal $\phi oe$ is selected to be a high level, when the levels of the internal output signals Do0 to dok are set up. The other input of the NAND gate NAG1 is supplied with an output signal of an inverter circuit N2, that is, an inverted, internal signal $\overline{ld}$. The input terminal of the inverter circuit N2 is supplied with an output signal of a level decision circuit LD.

The level decision circuit LD, although not limited thereto, includes two P-channel MOSFETs Q3 and Q4 that are connected in parallel between the power supply voltage of the circuit and the above mentioned output node ld, and an N-channel MOSFET Q13 that is connected between the output node ld and the ground voltage of the circuit. The gate of a MOSFET Q3 is connected with the corresponding, inverted signal line $\overline{D0}$, etc. of the internal bus BUS-A, and the gate of MOSFET Q4 is connected with the corresponding, non-inverted, signal line D0, etc. The gate of a MOSFET Q13 is supplied with the above mentioned timing signal $\phi pd$.

In relation to the above description and FIG. 28, when a signal has a non-inverted condition in the internal bus BUS-A and the timing signal $\phi pd$ is of high level, the MOSFET Q13 of the level decision circuit LD is switched on and precharging MOSFETs Q1 and Q2 are switched on in the bus driver BD of the processor unit PU. Therefore, an output signal ld of the level decision circuit LD has a low level, and the inverted internal signal $\overline{ld}$ has a high level, and moreover the corresponding inverted signal $\overline{D0}$ and non-inverted signal $\overline{D0}$ of the internal bus BUS-A are altogether precharged to a high level (the first level), for example the power supply voltage $V_{dd}$ of the circuit.

Subsequently, the timing signal $\phi pd$ is made a low level as shown in a cycle Cy.1 of FIG. 28, and at the same time, internal output signals do0 and so on are set to a logic 0, namely, low level. After a short delay, without any particular limitation, the timing signal $\phi oe$ is made a high level.

As the timing signal $\phi pd$ is made low level in the bus driver BD of the processor unit PU, the MOSFET Q13 of the level decision circuit LD is switched off, and therefore the precharging MOSFETs Q1 and Q2 are switched off, too. In this way, a precharging operation is stopped for each pair of complementary signal lines of the internal BUS-A. At that time, the MOSFETs Q3 and Q4 of the level decision circuit LD are both switched off, because the corresponding, inverted signal line $\overline{D0}$, etc. or the non-inverted signal line D0, etc. are precharged to a high level. So the output signal ld of the level decision circuit LD remains low level until either the MOSFET Q3 or Q4 is switched on, and therefore the inverted internal signal $\overline{ld}$ remains high level.

When the timing signal $\phi oe$ is made high level a short delay after the timing signal $\phi pd$ is made a low level, first the output signals of the NAND gate NAG1, that is, an inverted timing signal $\overline{\phi d0}$ and so on are changed to a low level in the bus driver BD of the processor unit PU. As a result, output signals of the NOR gate NOG2, that is, a non-inverted internal signal dc0, etc. change to a high level because an internal output signal do0, etc. have a low level, and therefore the discharging MOSFET Q12 is switched on. In this way, the non-inverted signal line D0, etc. of the internal bus BUS-A are discharged, and the signal level begin to decrease.

When a level of the non-inverted signal line D0, etc. of the internal bus BUS-A becomes lower than the power supply voltage $V_{dd}$ of the circuit by the threshold voltage $V_{thp}$ of a P-channel MOSFET Q4, the MOSFET Q4 is swithced on. Therefore, an output signal ld of the level decision circuit LD is changed to a high level, for example the power supply voltage $V_{dd}$ of the circuit, and an inverted, internal signal $\overline{ld}$ has a low level. Therefore, the inverted timing signal $\overline{\phi do}$ is changed to a high level, and a non-inverted, internal signal dc0, etc. changed to a low level. In this way, a discharging MOSFET Q12 is swithced off, and the discharging operation to a non-inverted signal line D0, etc. is stopped wherein the level of a non-inverted signal line D0, etc. remains fixed approximately to the discharging level (the second level) that is lower than the power supply voltage $V_{dd}$ of the circuit by the threshold voltage $V_{thp}$ of the P-channel MOSFET Q4, until the next precharging operation is started.

As shown in a cycle Cy.2 of FIG. 28, when an internal output signal do0, etc. is made logic 1, namely a high level, the bus driver BD of the processor unit PU receives a timing signal $\phi oe$ having a high level, and an inverted timing signal $\overline{\phi d}$ is changed to a low level, and then output signals of the NOR gate NOG1, namely an inverted internal signal $\overline{dc0}$, etc., are changed to a high level. Therefore, a discharging MOSFET Q11 is switched on and the discharging operation begins in the inverted signal line $\overline{D0}$, etc. of the internal bus BUS-A.

When a level of an inverted signal line D0, etc. of the internal BUS-A becomes lower than the power supply voltage $V_{dd}$ of the circuit by the threshold voltage $V_{thp}$ of a P-channel MOSFET Q3, the MOSFET Q3 of level decision circuit LD is switched on and the discharging operation to the inverted signal line $\overline{D0}$, etc. is stopped. In this way, a level of the inverted signal line $\overline{D0}$, etc. remains fixed approximately to the discharging level (the second level) that is lower than the power supply voltage $V_{dd}$ by the threshold voltage $V_{thp}$ of the P-channel MOSFET Q3.

Now, a bus receiver BR of the memory units MU0 to MUn, although not limited thereto, includes (k+1) unit bus receivers UBR0 to UBRk, which are used for each of the complementary signal lines D0, $\overline{D0}$~Dk, $\overline{Dk}$. These unit bus receivers are represented by a unit bus receiver UBR0 shown in FIG. 27. This unit bus receiver UBR0 has the same construction as the inventive sense amplifier shown in FIG. 1. Here, a timing signal φpr shown in FIG. 27 corresponds to the signal φsa of FIG. 1, and an internal signal ds0 of FIG. 27 corresponds to the signal Vout of FIG. 1.

Bus drivers BD in the memory units MU0 to MUn and a bus receiver BR in the processor unit PU have the same circuit construction as the bus driver BD in the processor unit PU and the bus receivers BR in the memory units MU0 to MUn, and have the same functions for two or more complementary signals that are transmitted through the internal bus BUS-B.

As described above, the digital processing system of this embodiment includes a processor unit PU, (n+1) memory units MU0 to MUn, and internal busses BUS-A, BUS-B that connect the processor unit and the memory units. The processor unit PU and the memory units MU0 to MUn include bus drivers BD and bus receivers BR corresponding to each internal bus, and each of these bus drivers and bus receivers has two or more unit bus drivers or unit bus receivers, which are set up corresponding to each complementary signal line of each internal bus. In this embodiment, each unit bus driver includes a P-channel precharging MOSFET which precharges a corresponding signal line to the power supply voltage of the circuit, an N-channel discharging MOSFET which, in a condition of signal transmission discharges a corresponding signal line according to a logic level of a signal transmitted therethrough and a level decision circuit which stops the discharging operation when a discharging level of a corresponding signal line reaches a predetermined level. Each unit bus receiver includes a level shift circuit LS which gives a certain bias level to complementary signals transmitted through a corresponding signal line, and a sensing circuit SC which receives an output signal of the level shift circuit LS and has the maximum amplification at the above mentioned bias level. In this way, digital processing system of this embodiment can reduce amplitudes of signals transmitted to a tenth, or one fifth or sixth of the usual MOS level when the system is added with the above mentioned interface circuits, which are constructed with CMOS having a rather simple circuit construction. As described above, the AC power consumption $P_D$ of a bus is calculated by the following equation value if C is a value of a dielectric capacitance that is connected with the bus, and wherein V and f are an the amplitude and frequency of a transmitting signal, respectively. In this embodiment, an amplitude V of a signal transmitted is decreased to a tenth, or one fifth or sixth, and therefore the AC power consumption $P_D$ in the bus is decreased to a square of a tenth, or one fifth or sixth. Therefore, the digital processing system can promote low power consumption thereby diminishing a requirement for increase of an area required for layout.

Figure 30:
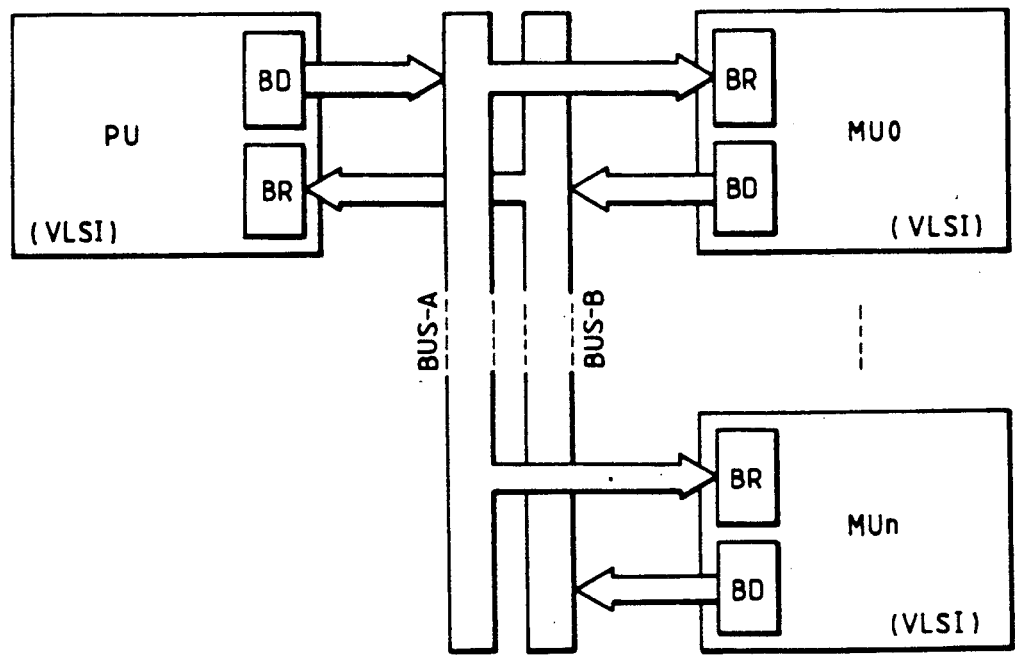
FIG. 30 is a block diagram of another embodiment of a digital processing means using signal transmission system according to the invention.

Although this invention has been described specifically in reference to the exemplified embodiments, it will be understood that various modifications may occur within the spirit and scope of this invention. For example, in FIG. 27, a timing signal φoe supplied to the bus driver BD may simply be a selective signal. The level decision circuit LD that detects a discharge level of each signal line can be constructed, for example, with a differential amplifier, which compares a level of each signal line with a predetermined reference voltage. Signal lines that form each internal bus need not be complementary signal lines. In this case, it is effective, for example, that a predetermined reference voltage is supplied to the gate of a MOSFET Q15 or Q16 that is included in the level shift circuit LS of a bus receiver BR. In FIG. 28, an inverting signal lien $\overline{D0}$ and a non-inverting signal line D0 may be discharged selectively when a transmitting signal has the reverse logic level and a precharging level of each signal line may preliminarily be set, for example, to the level where the sensing circuit SC has the maximum sensitivity. In this case, the level shift circuit LS of the bus receiver BR can be removed. Logic levels of each timing signal and their combinations are optional. In FIG. 29, two or more function blocks are implemented to construct a digital processing system of one chip as a large scale integrated circuit VLSI. However, these function blocks can be combined as individual large scale integrated circuits VLSI. In this case, BUS-A and BUS-B have the feature of an external bus. In either of the above mentioned constructions, BUS-A and BUS-B can be integrated as a two-directional bus. Furthermore, the specific circuit construction of a bus driver BD and a bus receiver BR shown in FIG. 27 and the block construction of the digital processing systems shown in FIG. 29 and FIG. 30 can be exemplified by various embodiments.

What is claimed is:

1. A sense amplifier comprising:
a level shift circuit having a pair of inputs and a pair of outputs for providing level shifted differential signals, wherein said level shift circuit includes at least first and second driver MOSFETs, each driver MOSFET having a drain coupled to receive a supply voltage potential, a source for outputting a level shifted differential signal and a gate for receiving an input differential signal, and a first pair of load MOSFETs connected as a current mirror, each load MOSFET being coupled between a source of one of said first and second driver MOSFETs and reference ground; and
a MOSFET differential sensing circuit having a pair of inputs respectively coupled to the outputs of said level shift circuit and providing an output level in accordance with the level shifted differential signals, so as to effect operation of said MOSFET differential sensing circuit in the saturation region.

2. A sense amplifier according to claim 1, wherein said level shift circuit and said differential sensing circuit each include a power MOS switch, each said power MOS switch being activated during a sense operation mode, said level shift circuit having its current mirror load MOS transistors coupled at their source to a ground reference through the drain-source path of a power MOS switch associated therewith.

3. A sense amplifier according to claim 2, wherein said level shift circuit further includes third and fourth load MOSFETs of a complementary channel type to that of said first pair of load MOSFETs, said third load MOSFET having a source and drain respectively connected to the drain and source of said first MOS driver transistor and said fourth load MOSFET having a source and drain respectively connected to the drain and source of said second MOS driver transistor, said third load MOSFET having a gate coupled to the common connection of the source of said second MOS driver transistor with the drain of said fourth load MOSFET and said fourth load MOSFET having a gate coupled to the common connection of the source of said first MOS driver transistor with the drain of said third load MOSFET.

4. A sense amplifier according to claim 3, wherein said third and fourth load MOSFETs have mutual conductances which are smaller than the mutual conductances of said first and second MOS driver transistors thereby magnifying the differential of the level shifted signals during a sensing operation.

5. A sense amplifier according to claim 4, wherein said first and second MOS driver transistors and said pair of load MOS transistors are N-channel conductivity type and said third and fourth load MOSFETs are P-channel conductivity type.

6. A sense amplifier according to claim 11, wherein said MOSFET differential sensing circuit is comprised of a first sensing means for detecting a first differential input signal condition thereof and a second sensing means for detecting a second, complementary differential input signal condition thereof, and wherein said first and second sensing means have commonly connected pairs of inputs respectively coupled to the outputs of said level shift circuit and each one of said first and second sensing means having an output for providing a corresponding output signal therefrom indicative of said differential input signal condition.

7. A sense amplifier according to claim 6, wherein said first and second sensing means respectively comprise first and second complementary MOS differential circuits, each one including a pair of driver MOSFETs respectively coupled in series with a corresponding one of a pair of loads between said supply voltage potential and reference ground.

8. A sense amplifier according to claim 7, wherein said first complementary MOS differential circuit includes third and fourth driver MOSFETs of a first channel conductivity type, and third and fourth load MOSFETs of a second, complementary channel conductivity type connected as a current mirror, said third driver MOSFET having a drain coupled to the drain of said third load MOSFET, a source coupled to the source of said fourth driver MOSFET and a gate coupled to a first output of said level shift circuit, said fourth driver MOSFET having a drain coupled to a common connection of the drain and gate of said fourth load MOSFET and gate of said third load MOSFET, said fourth driver MOSFET having a gate coupled to a second one of the pair of outputs of said level shift circuit; and wherein said second complementary MOS differential circuit includes fifth and sixth driver MOSFETs of said first channel conductivity type, and fifth and sixth load MOSFETs of said second channel conductivity type connected as a current mirror, said fifth driver MOSFET having a drain coupled to a common connection of the drain and gate of said fifth load MOSFET and gate of said sixth load MOSFET, a source coupled to a source of said sixth driver MOSFET and a gate coupled to the first output of said level shift circuit, said sixth driver MOSFET having a drain coupled to a drain of said sixth load MOSFET and a gate coupled to the second output of said level shift circuit, wherein the outputs of said first and second sensing means are respectively provided from the drain of said third driver MOSFET and the drain of said sixth driver MOSFET.

9. A sense amplifier according to claim 8, wherein said level shift circuit and said first and second complementary MOS differential circuits each include a driving MOSFET, said driving MOSFETs being activated simultaneously during a sensing operation thereby coupling to reference ground the commonly coupled sources of the respective driver MOSFETs of said level shift circuit, and of the driver MOSFETs of said first and second complementary MOS differential circuits.

10. A sense amplifier according to claim 9, wherein the driver MOSFETs and load MOSFETs of said level shift circuit are of said first channel conductivity type.

11. A sense amplifier according to claim 10, wherein said first and second channel conductivity type are n-type and p-type, respectively.

12. A sense amplifier according to claim 9, wherein said first and second channel conductivity type are n-type and p-type, respectively.

13. A sense amplifier according to claim 9, further including:
prechargingmeans for precharging the inputs of said level shift circuit and the outputs of said first and second complementary MOS differential circuits to a level of about said supply voltage potential prior to initiation of said sensing operation.

14. A sense amplifier according to claim 13, wherein said precharging means is comprised of respective MOSFETs of said second channel conductivity type controllably applying a precharge level of about said supply voltage potential at each of said level shift circuit inputs and said first and second complementary MOS differential circuit outputs during a precharging mode thereof.

15. A sense amplifier according to claim 13, further including:
an output latch for providing an output signal thereof in accordance with the output signals provided by said first and second complementary MOS differential circuits.

16. A sense amplifier according to claim 15, wherein said output latch is comprised of a latched pull-up, pull-down switching circuit arrangement.

17. A sense amplifier according to claim 6, further including:
precharging means for precharging the inputs of said level shift circuit and the outputs of said first and second sensing means to a level of about said supply voltage potential prior to initiation of said sensing operation.

18. A sense amplifier according to claim 17, further including an output latch for providing an output signal thereof in accordance with the output signals provided by said first and second sensing means.

19. A sense amplifier according to claim 17, wherein said first and second sensing means operate in response to level shifted complementary input signals during the sensing operation which level shifted complementary signals have an average potential level therebetween of about half the magnitude of said supply voltage potential.

20. A sense amplifier according to claim 6, wherein said first and second sensing means operate in response to level shifted complementary input signals during the sensing operation which level shifted complementary signals have an average potential level therebetween of about half the magnitude of said supply voltage potential.

21. A sense amplifier according to claim 1, wherein said MOSFET differential sensing circuit includes a complementary MOS differential circuit comprised of third, fourth, fifth and sixth driver MOSFETs of a first channel conductivity type and seventh, eighth and ninth MOSFETs of a second, complementary channel conductivity type, said seventh through ninth MOSFETs being arranged as a composite current mirror forming the loads for said differential sensing circuit, wherein said third, fourth, fifth and sixth MOSFETs have commonly coupled sources, said third and fourth MOSFETs have gates commonly forming a first of said pair of inputs, said fifth and sixth MOSFETs have gates commonly forming a second of said pair of inputs, said third MOSFET having a drain coupled to a drain of said seventh MOSFET, said fourth MOSFET having a drain coupled to a drain of each of said fifth and eighth MOSFETs, said sixth MOSFET having a drain coupled to a drain of said ninth MOSFET, said seventh, eighth and ninth MOSFETs each have a source commonly coupled for receiving a supply potential and have commonly coupled gates, said eighth MOSFET having its gate coupled to its drain, and wherein first and second, complementary outputs are provided at the drains of said third and sixth MOSFETs, respectively.

22. A sense amplifier according to claim 21, further including:
prechargingmeans for precharging at least the inputs of said level shift circuit to a level of about said supply voltage potential prior to initiation of said sensing operation.

23. A sense amplifier according to claim 21, wherein said precharging means precharges the pair of inputs of said level shift circuit and the pair of outputs of said MOSFET differential sensing circuit to a level of about said supply voltage potential prior to initiation of said sensing operation.

24. A sense amplifier according to claim 23 further including an output latch for providing a single ended output signal thereof in accordance with the output signals provided by said MOSFET differential sensing circuit.

25. A sense amplifier according to claim 24, wherein said level shift circuit and said MOSFET differential sensing circuit each include a driving MOSFET, said driving MOSFET being activated simultaneously during the sensing operation thereby coupling to reference ground the commonly coupled sources of said third through sixth driver MOSFETs and the sources of said load MOSFETs of said level shift circuit.

26. A sense amplifier according to claim 22, wherein said level shift circuit and said MOSFET differential sensing circuit each include a driving MOSFET, said driving MOSFET being activated simultaneously during the sensing operation thereby coupling to reference ground the commonly coupled sources of said third through sixth driver MOSFETs and the sources of said load MOSFETs of said level shift circuit.

27. A sense amplifier according to claim 21, wherein said level shift circuit and said MOSFET differential sensing circuit each include a driving MOSFET, said driving MOSFET being activated simultaneously during the sensing operation thereby coupling to reference ground the commonly coupled sources of said third through sixth driver MOSFETs and the sources of said load MOSFETs of said level shift circuit.

28. A sense amplifier comprising:
a level shift circuit having a pair of inputs responsive to complementary first and second differential input signal conditions and a pair of outputs for providing, in accordance with said inputs thereof, corresponding level shifted complementary signals during a sensing operation, said inputs being initially precharged to a level of about a supply voltage potential; and
a MOSFET differential sensing circuit, powered by said supply voltage potential, having a pair of inputs respectively coupled to the outputs of said level shift circuit and providing complementary outputs in accordance with said level shifted complementary signals, wherein said level shifted complementary signals have a potential differential therebetween with an intermediate level of about half said supply voltage potential.

29. A sense amplifier according to claim 28, wherein said level shift circuit includes at least first and second driver MOSFETs arranged as source followers and which are respectively coupled with first and second load MOSFETs, connected as a current mirror, in series therewith between said supply voltage potential and a reference ground.

30. A sense amplifier according to claim 29, wherein said level shift circuit and said differential sensing circuit each include a power MOS switch, each said power MOS switch being activated during a sense operation mode, said level shift circuit having its current mirror load MOS transistors coupled at their source to said ground reference through the drainsource path of said power MOS switch associated therewith.

31. A sense amplifier according to claim 30, wherein said level shift circuit further includes third and fourth load MOSFETs of a complementary channel type to that of said first and second load MOSFETs, said third load MOSFET having a source and drain respectively connected to the drain and source of said first MOS driver transistor and said fourth load MOSFET having a source and drain respectively connected to the drain and source of said second MOS driver transistor, said third load MOSFET having a gate coupled to the common connection of the source of said second MOS driver transistor with the drain of said fourth load MOSFET and said fourth load MOSFET having a gate coupled to the common connection of the source of said first MOS driver transistor with the drain of said third load MOSFET.

32. A sense amplifier according to claim 31, wherein said third and fourth load MOSFETs have mutual conductances which are smaller than the mutual conductances of said first and second MOS driver transistors thereby magnifying the differential of the level shifted signals during a sensing operation.

33. A sense amplifier according to claim 32, wherein said first and second MOS driver transistors and said first and second load MOS transistors are N-channel conductivity type and said third and fourth load MOSFETs are P-channel conductivity type.

34. A sense amplifier according to claim 29, wherein said MOSFET differential sensing circuit is comprised of a first sensing means for detecting said first differential input signal condition and a second sensing means for detecting said second, complementary differential input signal condition, and wherein said first and second sensing means have commonly connected pairs of inputs respectively coupled to the outputs of said level shift circuit and each one of said first and second sensing means having an output for providing a corresponding output signal therefrom indicative of said differential input signal condition.

35. A sense amplifier according to claim 34, wherein said first and second sensing means respectively comprise first and second complementary MOS differential circuits, each one including a pair of driver MOSFETs respectively coupled in series with a corresponding one of a pair of loads between said supply voltage potential and reference ground.

36. A sense amplifier according to claim 35, wherein said first complementary MOS differential circuit includes third and fourth driver MOSFETs of a first channel conductivity type, and third and fourth load MOSFETs of a second, complementary channel conductivity type connected as a current mirror, said third driver MOSFET having a drain coupled to the drain of said third load MOSFET, a source coupled to the source of said fourth driver MOSFET and a gate coupled to a first output of said level shift circuit, said fourth driver MOSFET having a drain coupled to a common connection of the drain and gate of said fourth load MOSFET and gate of said third load MOSFET, said fourth driver MOSFET having a gate coupled to a second one of the pair of outputs of said level shift circuit; and wherein said second complementary MOS differential circuit includes fifth and sixth driver MOSFETs of said first channel conductivity type, and fifth and sixth load MOSFETs of said second channel conductivity type connected as a current mirror, said fifth driver MOSFET having a drain coupled to a common connection of the drain and gate of said fifth load MOSFET and gate of said sixth load MOSFET, a source coupled to a source of said sixth driver MOSFET and a gate coupled to the first output of said level shift circuit, said sixth driver MOSFET having a drain coupled to a drain of said sixth load MOSFET and a gate coupled to the second output of said level shift circuit, wherein the outputs of said first and second sensing means are respectively provided from the drain of said third driver MOSFET and the drain of said sixth MOSFET.

37. A sense amplifier according to claim 36, wherein said level shift circuit and said first and second complementary MOS differential circuits each include a driving MOSFET, said driving MOSFETs being activated simultaneously during a sensing operation thereby coupling to reference ground the commonly coupled sources of the respective driver MOSFETs of said level shift circuit, and of the driver MOSFETs of said first and second complementary MOS differential circuits.

38. A sense amplifier according to claim 37, wherein the driver MOSFETs and load MOSFETs of said level shift circuit are of said first channel conductivity type.

39. A sense amplifier according to claim 38, wherein said first and second channel conductivity type are n-type and p-type, respectively.

40. A sense amplifier according to claim 34, further including:

precharging means for precharging the inputs of said level shift circuit and the outputs of said first and second sensing means to a level of about said supply voltage potential prior to initiation of said sensing operation.

41. A sense amplifier according to claim 40, further including an output latch for providing an output signal thereof in accordance with the output signals provided by said first and second sensing means.

42. A sense amplifier according to claim 41, wherein said output latch is comprised of a latched pull-up, pull-down switching circuit arrangement.

43. A sense amplifier according to claim 28, wherein said MOSFET differential sensing circuit includes a complementary MOS differential circuit comprised of first, second, third and fourth driver MOSFETs of a first channel conductivity type and fifth, sixth and seventh MOSFETs of a second, complementary channel conductivity type, said fifth through seventh MOSFETs being arranged as a composite current mirror forming the loads for said differential sensing circuit, wherein said first, second, third and fourth MOSFETs have commonly coupled sources, said first and second MOSFETs have gates commonly forming a first of said pair of inputs, said third and fourth MOSFETs have gates commonly forming a second of said pair of inputs, said first MOSFET having a drain coupled to a drain of said fifth MOSFET, said second MOSFET having a drain coupled to a drain of each of said third and sixth MOSFETs, said fourth MOSFET having a drain coupled to a drain of said seventh MOSFET, said fifth, sixth and seventh MOSFETs each have a source commonly coupled for receiving a supply potential and have commonly coupled gates, said sixth MOSFET having its gate coupled to its drain, and wherein first and second, complementary outputs are provided at the drains of said first and fourth MOSFETs, respectively.

44. A sense amplifier according to claim 43, wherein said level shift circuit includes at least eighth and ninth driver MOSFETs disposed as source followers and tenth and eleventh load MOSFETs, disposed as a current mirror, and respectively coupled in series with said eighth and ninth driver MOSFETs between said supply voltage and reference ground.

45. A sense amplifier according to claim 44, wherein said level shift circuit and said MOSFET differential sensing circuit each include a driving MOSFET, said driving MOSFET being activated simultaneously during the sensing operation thereby coupling to reference ground the commonly coupled sources of said third through sixth driver MOSFETs and the sources of said load MOSFETs of said level shift circuit.

46. A sense amplifier according to claim 43, further including:

precharging means for precharging at least the inputs of said level shift circuit to a level of about said supply voltage potential prior to initiation of said sensing operation.

47. A sense amplifier according to claim 46, further including an output latch for providing a single ended output signal thereof in accordance with the output signals provided by said MOSFET differential sensing circuit.

48. A signal transmission system having at least a driver and a receiver, wherein said receiver is comprised of:

a level shift circuit having a pair of inputs responsive to complementary first and second differential input signal conditions and a pair of outputs for providing, in accordance with said inputs thereof, corresponding level shifted complementary signals during a sensing operation, said inputs being initially precharged to a level of about a supply voltage potential; and a MOSFET differential sensing circuit, powered by said supply voltage potential, having a pair of inputs respectively coupled to the outputs of said level shift circuit and providing complementary outputs in accordance with said level shifted complementary signals, wherein said level shifted complementary signals have a potential differential therebetween with an intermediate level of about half said supply voltage potential.

49. A signal transmission system according to claim 48, wherein said level shift circuit includes at least first and second driver MOSFETs arranged as source followers and which are respectively coupled with first and second load MOSFETs, connected as a current mirror, in series therewith between said supply voltage potential and reference ground.

50. A signal transmission system according to claim 49, wherein said level shift circuit and said differential sensing circuit each include a power MOS switch, each said power MOS switch being activated during a receiving operation mode, said level shift circuit having its current mirror load MOS transistors coupled at their source to a ground reference through the drain-source path of a power MOS switch associated therewith.

* * * * *